(12) United States Patent
Toh et al.

(10) Patent No.: US 9,859,415 B2
(45) Date of Patent: Jan. 2, 2018

(54) HIGH VOLTAGE TRANSISTOR

(71) Applicant: GLOBALFOUNDRIES Singapore Pte. Ltd., Singapore (SG)

(72) Inventors: Eng Huat Toh, Singapore (SG); Xinfu Liu, Singapore (SG); Xueming Dexter Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/856,574

(22) Filed: Sep. 17, 2015

(65) Prior Publication Data

US 2017/0084736 A1  Mar. 23, 2017

(51) Int. Cl.
| | |
|---|---|
| *H01L 29/78* | (2006.01) |
| *H01L 29/51* | (2006.01) |
| *H01L 29/06* | (2006.01) |
| *H01L 29/66* | (2006.01) |

(52) U.S. Cl.
CPC ...... *H01L 29/7816* (2013.01); *H01L 29/0649* (2013.01); *H01L 29/513* (2013.01); *H01L 29/518* (2013.01); *H01L 29/66681* (2013.01); *H01L 29/7833* (2013.01)

(58) Field of Classification Search
CPC ........... H01L 21/28282; H01L 29/7835; H01L 29/0696; H01L 29/7816
See application file for complete search history.

(56) References Cited

U.S. PATENT DOCUMENTS

| | | | | |
|---|---|---|---|---|
| 2011/0110156 | A1* | 5/2011 | Kawashima | H01L 21/28282 365/185.08 |
| 2012/0228704 | A1* | 9/2012 | Ju | H01L 29/402 257/339 |
| 2012/0299084 | A1* | 11/2012 | Saito | H01L 21/28282 257/324 |
| 2013/0181286 | A1* | 7/2013 | Zhang | H01L 29/4983 257/335 |
| 2013/0320432 | A1* | 12/2013 | Ng | H01L 21/823487 257/329 |
| 2016/0020219 | A1* | 1/2016 | Chuang | H01L 27/11573 257/324 |

* cited by examiner

*Primary Examiner* — Julia Slutsker
(74) *Attorney, Agent, or Firm* — Horizon IP PTE Ltd.

(57) ABSTRACT

High voltage devices and methods for forming a high voltage device are disclosed. The high voltage device includes a substrate prepared with a device isolation region. The device isolation region defines a device region. The device region includes at least first and second source/drain regions and a gate region defined thereon. A device well is disposed in the device region. The device well encompasses the at least first and second source/drain regions. A primary gate and at least one secondary gate adjacent to the primary gate are disposed in the gate region. The at least first and second source/drain regions are displaced from first and second sides of the primary gate.

20 Claims, 25 Drawing Sheets

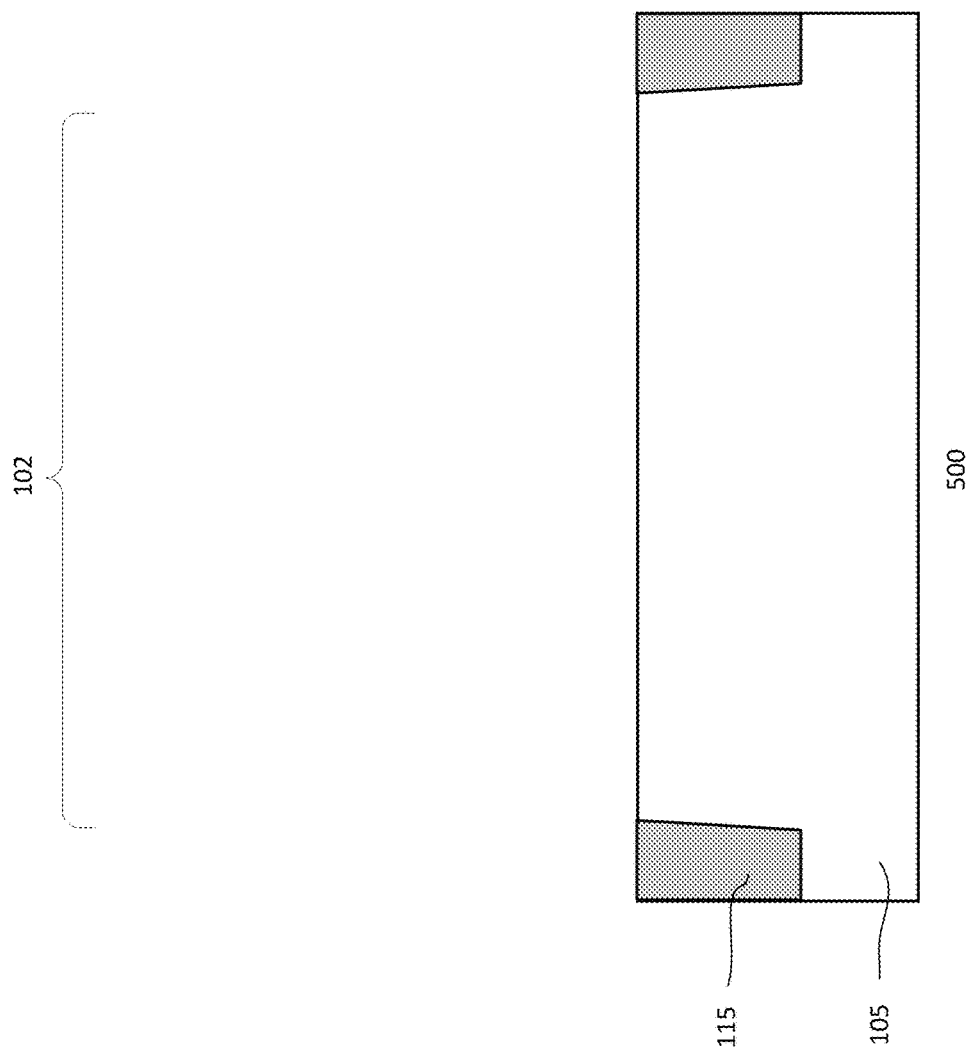

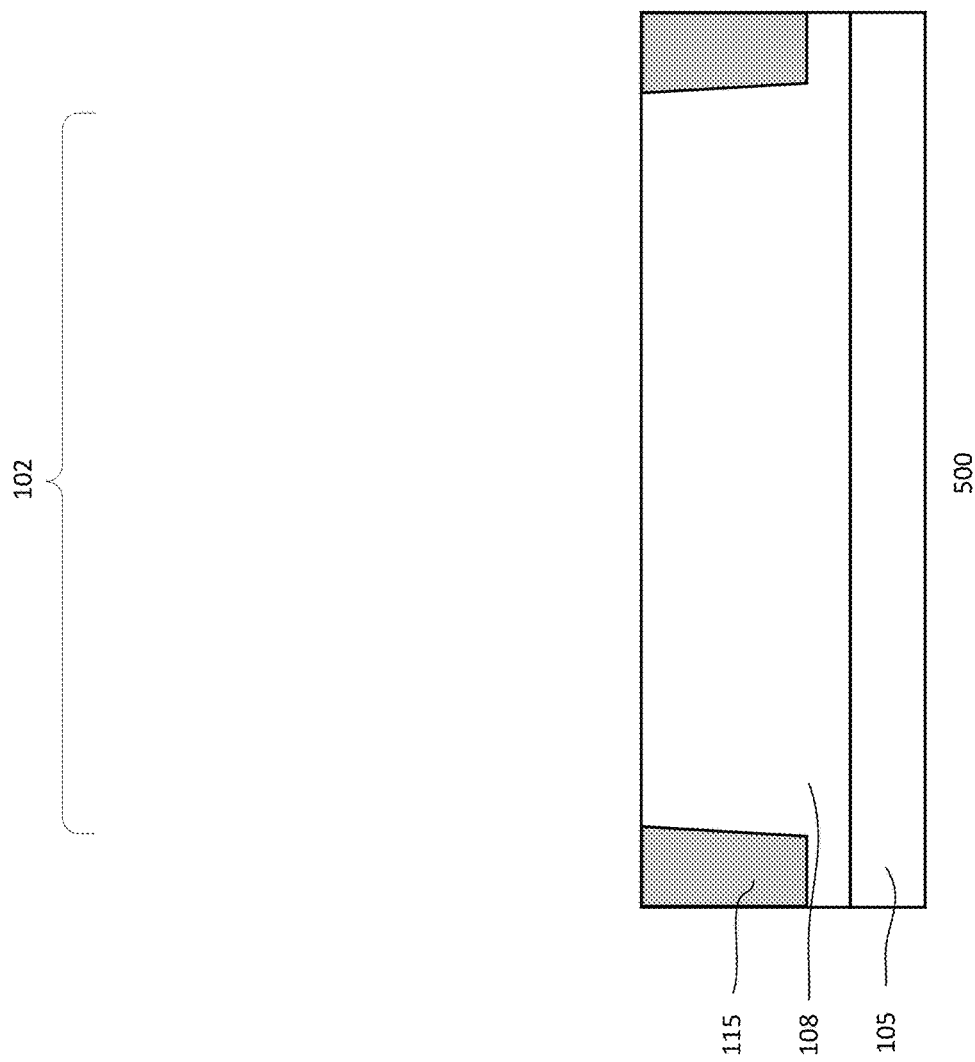

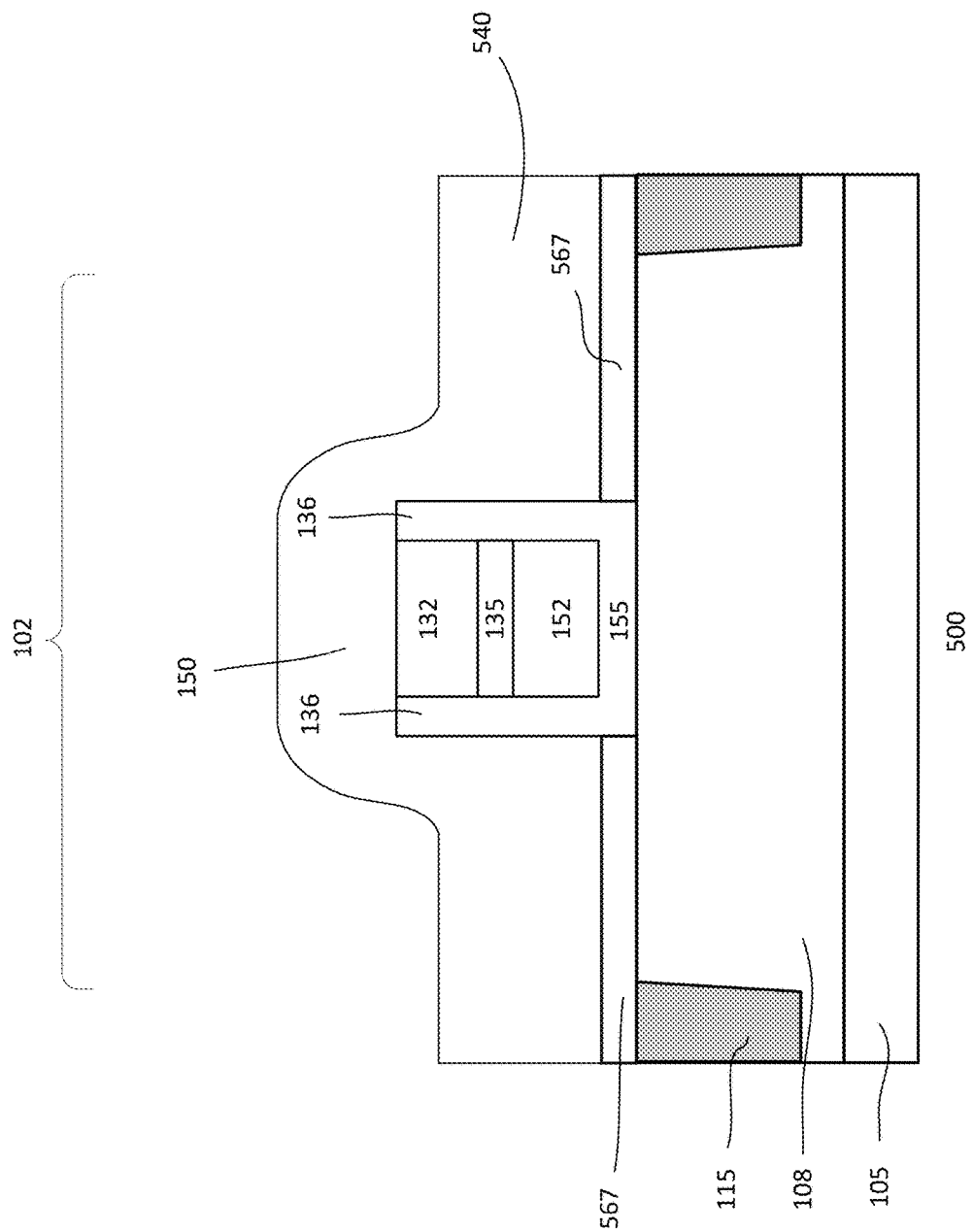

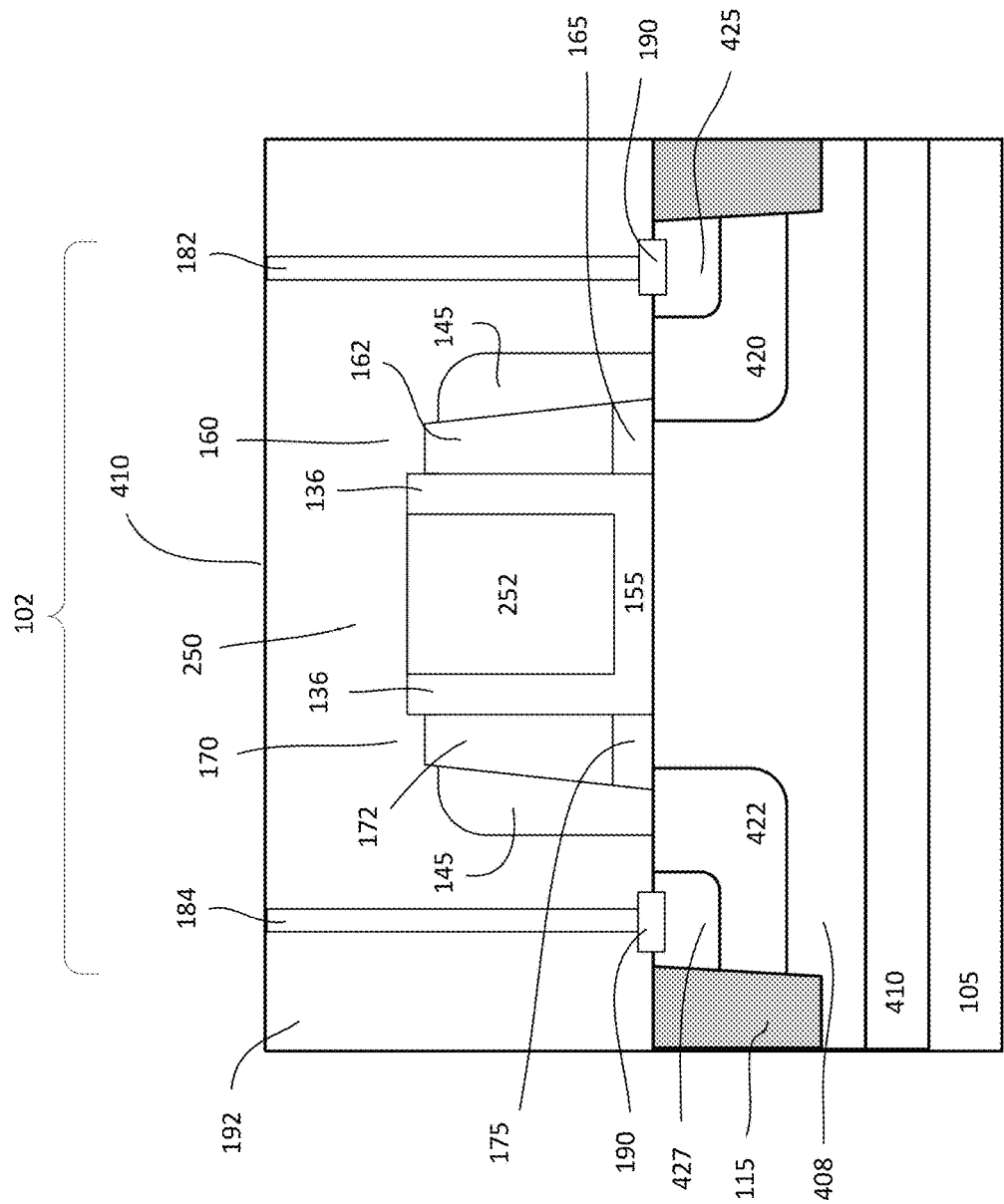

HIGH VOLTAGE TRANSISTOR

BACKGROUND

High voltage devices, such as high voltage field-effect transistors, having high breakdown voltage and low on-state resistance are used in, for example, power management products. The performance of the high voltage transistors depends on the drain-to-source on-resistance ($R_{dson}$) as well as breakdown voltage (Vbr). For example, low $R_{dson}$ results in high switching speed while high Vbr increases voltage capabilities. However, $R_{dson}$ and Vbr of high voltage devices are typically inversely related. Thus, there is a tradeoff between $R_{dson}$ and Vbr during performance optimizations. Increasing the high Vbr of high voltage devices may sometimes undesirably lead to an increase in external resistance (Rext). The increase of Rext, however, degrades the performance of the high voltage device.

Accordingly, there is a need to provide improved high voltage devices which have low $R_{dson}$ as well as high Vbr. Moreover, there is also a desire to provide simplified and cost effective methods to form these high voltage devices.

SUMMARY

Embodiments generally relate to semiconductor devices and methods for forming semiconductor devices. In one embodiment, a high voltage device is disclosed. The high voltage device includes a substrate prepared with a device isolation region. The device isolation region defines a device region. The device region includes at least first and second source/drain regions and a gate region defined thereon. A device well is disposed in the device region. The device well encompasses the at least first and second source/drain regions. A primary gate and at least one secondary gate adjacent to the primary gate are disposed in the gate region. The at least first and second source/drain regions are displaced from first and second sides of the primary gate.

In another embodiment, a high voltage device is disclosed. The high voltage device includes a substrate having a device region. The device region includes at least first and second source/drain regions and a gate region defined thereon. A device well is disposed in the device region. The device well encompasses the at least first and second source/drain regions. A primary gate and at least one secondary gate adjacent to the primary gate are disposed in the gate region. The primary gate and the at least one secondary gate each includes a gate dielectric with a thickness. The thickness of the gate dielectric of the primary gate is different from the thickness of the gate dielectric of the at least one secondary gate. The at least first and second source/drain regions are displaced from first and second sides of the primary gate.

In yet another embodiment, a method for forming a high voltage device is disclosed. The method includes providing a substrate having a device isolation region. The device isolation region defines a device region and the device region includes a gate region defined thereon. A device well is formed within the device region. A primary gate and at least one secondary gate adjacent to the primary gate are formed in the gate region. First and second diffusion regions are formed within the device well and adjacent to first and second sides of the primary gate. The first and second diffusion regions are displaced from the first and second sides of the primary gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 5a-5j show cross-sectional views of an embodiment of a process for forming a device;

FIGS. 7a-7c show cross-sectional views of another embodiment of a process for forming a device.

DETAILED DESCRIPTION

Embodiments generally relate to semiconductor devices or integrated circuits (ICs). More particularly, embodiments relate to high voltage (HV) devices. For example, HV devices include HV transistors, such as metal oxide semiconductor (MOS) transistors. In some embodiments, the HV transistors may be standalone or may be integrally formed with other types of devices, such as non-volatile memory (NVM) devices, low voltage (LV) and medium voltage (MV) devices on the same substrate. Other types of devices may also be applicable. The devices or ICs can be incorporated into or used with various types of products which require high power, for example, consumer electronic products, portable consumer products such as smart phones, mobile phones, tablets, TV displays and personal digital assistants (PDA).

Figure 1A:
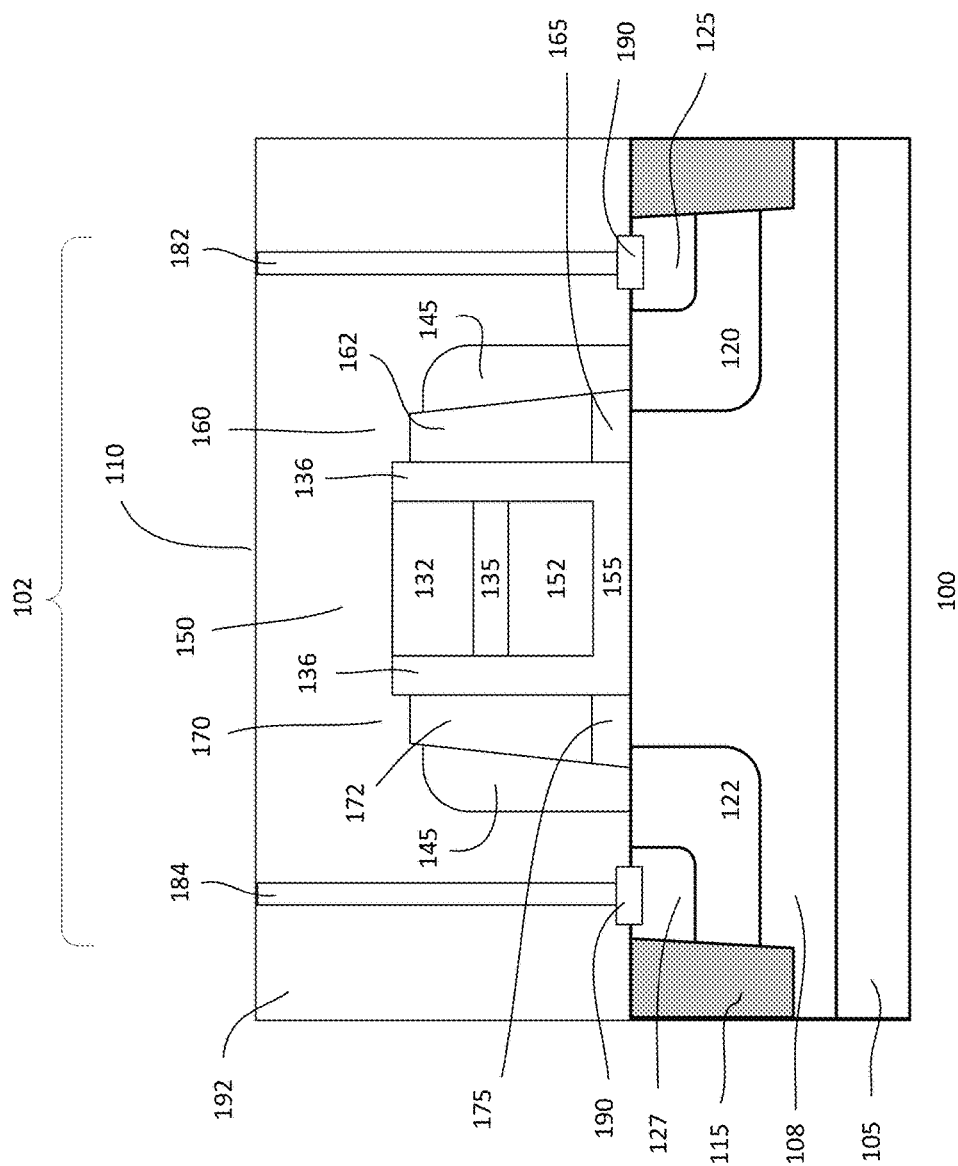
FIGS. 1a-1c show cross-sectional views of an embodiment of a device.
Figure 1B:
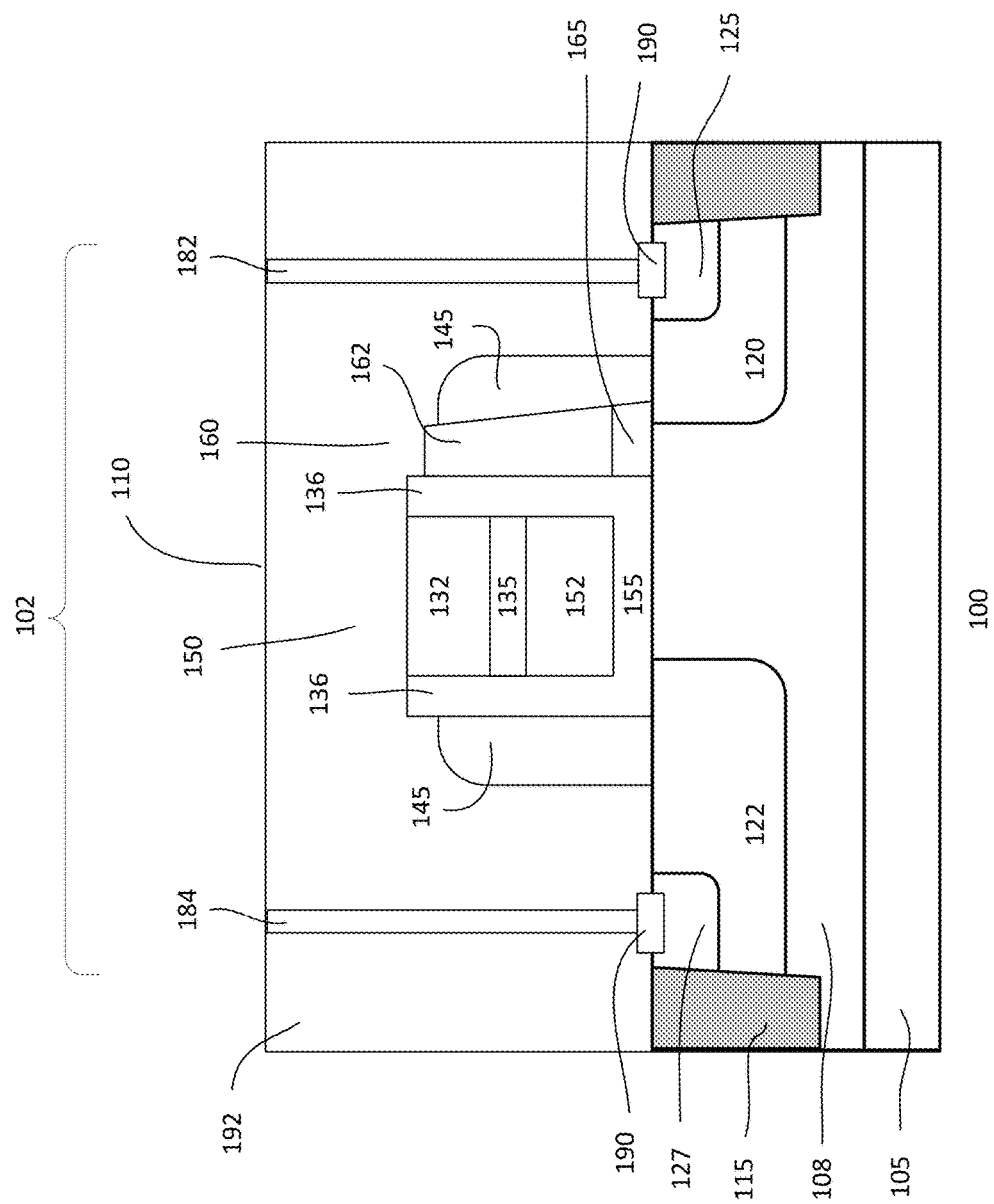
Figure 1C:
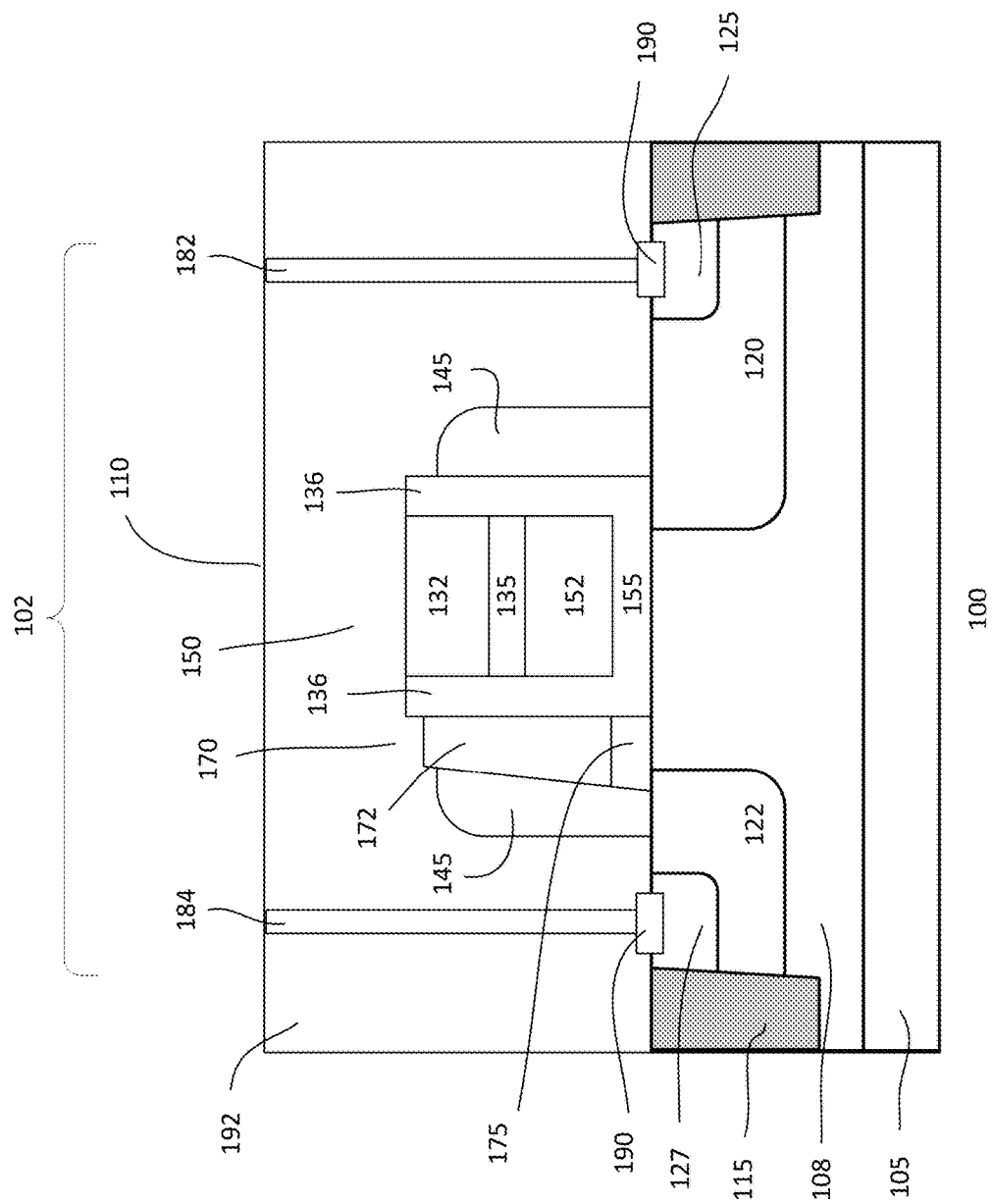

FIGS. 1a-1c show cross-sectional views of an embodiment of a device 100. The device is, for example, an IC. Other types of devices may also be useful. The device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p-type or n-type. A lightly doped region may have a dopant concentration of about 1E14-1E17/cm$^3$. An intermediately doped region may have a dopant concentration from about 1E17-1E19/cm$^3$. A heavily doped region may have a dopant concentration of about 1E19-1E21/cm$^3$. Other concentrations of the different types of doped regions may also be useful. P-type dopants may include boron (B), fluorine (F), aluminum (Al), indium (In) or a combination thereof, while n-type dopants may include phosphorous (P), arsenic (As), antimony (Sb) or a combination thereof.

The substrate 105 includes a device (or active) region 102 surrounded by a device isolation region 115. The device region 102 is, for example, suitable for accommodating a high voltage (HV) device. In one embodiment, the device region includes a HV transistor 110. Providing other types of devices in the device region may also be useful. The HV transistor may operate in, for example, about 12-40 V regime. The HV transistor may also operate in other suitable voltage ranges, depending on design requirements and technology node. Providing other types of device regions may also be useful. The substrate may also include regions (not shown) for other types of circuitry, depending on the type of device or IC. For example, the device may also include regions for MV and LV devices as well as an array region for a plurality of interconnected memory devices, such as NVM devices.

The device region 102 is isolated from other regions by the device isolation region 115. For example, the isolation region surrounds the device region. The isolation region, for example, is a shallow trench isolation (STI) region. A STI region includes an isolation trench filled with isolation or dielectric materials. Other types of device isolation regions may also be employed. The STI region, for example, extends to a depth of about 1000-5000 Å with respect to the substrate surface. Providing isolation regions having other depth dimensions may also be useful. For example, the isolation region may be a deep trench isolation (DTI) region. The dimensions, for example, may depend on isolation requirements.

A device well 108 may be disposed in the substrate. The device well is, for example, disposed in the device region. In one embodiment, the device well has a depth deeper than the device isolation region. For example, the device well extends below and underlaps a portion of the isolation region 115. The device well is doped with second polarity type dopants and serves as a body for a transistor. In one embodiment, the device well is a second polarity type well for a first polarity type transistor. For example, the device well may be doped with p-type dopants for a n-type transistor. Other configurations of device well and device may also be useful. For example, the first polarity type dopants may be p-type and the second polarity type dopants may be n-type. The dopant concentration of the device well may be light to intermediate. The dopant concentration of the device well, for example, is about $1E14-1E18/cm^3$. The depth of the device well is, for example, about 0.1-5 µm. Other suitable depths and dopant concentrations for the device well may also be useful. The device well may be suitably doped to accommodate a HV device.

As described, a HV transistor 110 is disposed in the device region 102. The transistor includes a primary gate 150 disposed between first and second diffusion regions 125 and 127. The primary gate is disposed on the substrate while the diffusion regions are disposed in the substrate. The first and second diffusion regions may serve as first and second source/drain (S/D) regions of the transistor 110. For example, the first diffusion region 125 may be the drain region and the second diffusion region 127 may be the source region. Other configurations of S/D regions may also be useful. For example, the source and drain regions may be interchangeable. A channel of the transistor is located in the substrate under the primary gate and between the S/D regions.

As shown in FIG. 1a, the transistor includes first and second secondary gates 160 and 170 adjacent to the sides of the primary gate 150. The primary gate may be referred to as a transistor gate and the secondary gates may be referred to as side gates. For example, the primary (or transistor) gate 150 is disposed between the first and second secondary (or side) gates 160 and 170. In one embodiment, the first side gate 160 is adjacent to a first side of the transistor gate and the second side gate 170 is adjacent to a second side of the transistor gate. For example, the first side gate is positioned between the transistor gate and first S/D region 125 and the second side gate is positioned between the transistor gate and second S/D region 127. For example, the first side gate may be on a drain side of the transistor while the second side gate may be on a source side of the transistor. Other primary and secondary gate configurations may also be useful. The first side gate serves as a field plate gate (FPG) and the second side gate serves as a source side dual gate (SSDG).

In some other embodiments, the transistor may include an asymmetrical secondary gate configuration. For example, a first secondary gate may be disposed adjacent to a side of the transistor gate while the opposite side of the transistor gate is devoid of a second secondary gate.

The transistor gate and first and second side gates include a gate electrode over a gate dielectric. A gate electrode, for example, includes polysilicon. Other types of gate electrode materials may also be useful. For example, the gate electrode may include metal material, such as TaN or TiN. As for the gate dielectric of the transistor gate and side gates, it can be silicon oxide. For example, the gate dielectric may be formed of thermal silicon oxide. Other types of gate dielectric materials, such as silicon nitride, may also be useful. The material of the gate electrode and gate dielectric may depend on the technology. Other configurations of gate electrode and gate dielectric are also useful.

The transistor gate 150, in one embodiment, is a HV gate. The HV gate, in one embodiment, includes a HV gate electrode over a HV gate dielectric. The HV gate electrode, in one embodiment, includes a width or gate length of about 1-50 µm. Providing a HV gate electrode having other suitable width dimensions may also be useful. In one embodiment, the HV gate dielectric 155 includes a thick gate dielectric layer. The gate dielectric layer, for example, has a thickness of about 50-300 Å. A HV gate dielectric having other suitable thicknesses may also be useful. For example, the HV gate dielectric thickness may depend on a maximum operation voltage. Other suitable configurations of HV gate may also be useful.

In one embodiment, the transistor gate may be formed in the same manufacturing process as a memory device, such as a NVM device. The NVM device, for example, may be a split-gate NVM device. In such cases, the transistor gate may include a gate stack over a gate dielectric 155, as shown. The transistor gate stack, in one embodiment, includes top and bottom gate electrodes 132 and 152 separated by an inter-gate layer 135. The top and bottom gate electrodes are, for example, polysilicon while the inter-gate layer, for example, includes dielectric layer/stack. In one embodiment, the inter-gate layer is a multi-layered dielectric stack. For example, the dielectric stack may include a nitride layer sandwiched by first and second oxide layers, forming an oxide-nitride-oxide (ONO) stack. Other configurations of inter-gate layer may also be useful. The thickness of the inter-gate layer is, for example, about 100-200 Å. Providing an inter-gate layer having other suitable thicknesses may also be useful. The bottom gate electrode 152 serves as the HV gate electrode while the inter-gate layer 135 and the top gate electrode layer 132 may be formed as part of the NVM device manufacturing process. Other configurations of the transistor gate stack may also be useful. In one embodiment, the HV gate electrode may be a doped electrode. For example, the bottom gate electrode of the transistor gate stack may be a polysilicon gate electrode doped with transistor type dopants to reduce conductive resistance.

In an alternative embodiment, the transistor gate may be formed in a separate manufacturing process from the NVM device. In such case, a single gate electrode layer, such as that shown in FIG. 2, forms the transistor gate electrode 252. The transistor gate electrode, for example, serves as the HV gate electrode.

Inter-poly dielectric layers 136 separate the HV gate from the first and second side gates. In one embodiment, inter-poly dielectric layers are disposed on first and second sides of the HV gate. For example, inter-poly dielectric layers line the sidewalls of the HV gate electrode/gate stack. An inter-poly dielectric layer includes a width sufficiently thick to isolate the HV gate from the side gates. The width of an inter-poly dielectric layer is, for example, about 100-300 Å. Other suitable thicknesses and other suitable configurations of inter-poly dielectric layers may also be useful. The inter-poly dielectric layer may be an oxide layer. For example, inter-poly oxide (IPO) layers isolate the HV gate from the side gates. Other suitable types of inter-poly dielectric material, such as nitride, may also be useful.

The first and second side gates 160 and 170 include gate electrode layers 162 and 172 over gate dielectric layers 165 and 175 respectively. As shown, the first and second side gate electrodes are positioned adjacent to the inter-poly dielectric layers 136. The gate electrode layers may include polysilicon. For example, the first and second side gate electrodes are formed of the same polysilicon layer. In one embodiment, the HV gate and side gates are polysilicon gates. Having a HV gate that is formed of a different material than the side gates may also be useful. For example, the HV gate may be a metal gate while the side gates may be polysilicon gates. In one embodiment, the gate dielectric layers of the side gates include a thickness different from the gate dielectric thickness of the transistor gate. The gate dielectric layer of the side gates may include any suitable thicknesses, depending on design and process requirements. Other configurations of side gates and HV gate may also be useful.

In one embodiment, the first and second side gates as disposed adjacent to the transistor gate are in the form of gate spacer and with slanted sidewall profile. As shown, the first and second side gates may have a top surface which is non-coplanar with top surface of the HV gate, resulting in non-planar top surface. In an alternative embodiment, the first and second side gates may include a substantially vertical sidewall profile and/or a top surface which is substantially coplanar with the top surface of the transistor gate. For example, the transistor gate and side gates may include top surfaces which are substantially coplanar with each other. Providing other suitable surface profiles for the transistor gate and side gates may also be useful.

Dielectric spacers 145 may be provided on the sides of the side gates. For example, spacers may be disposed on outer (or exposed) sidewalls of the first and second side gates. The spacers, for example, include a dielectric material, such as silicon oxide, silicon nitride or a combination thereof. Other suitable types of dielectric materials may also be used for the sidewall spacers. The spacers may be used to facilitate forming transistor S/D regions.

As described, the first and second transistor S/D regions 125 and 127 are disposed in the substrate within the device well 108. The S/D regions may be heavily doped with transistor type dopants. For example, the S/D regions are heavily doped with first polarity dopants for a first polarity type transistor. The first polarity type may be n-type for a n-type transistor or p-type for a p-type transistor. In one embodiment, transistor type dopants are first polarity type for a second polarity type device well. For example, the transistor type dopants are n-type for a p-type device well. Other configurations of S/D regions and device well may also be useful. For example, the first polarity type may be p-type and the second polarity type may be n-type. The S/D regions include a depth from the substrate surface. The depth of the S/D region 125 or 127 is, for example, about 0.1-0.3 μm. Other suitable depth dimensions for the S/D region may also be useful.

In one embodiment, the transistor S/D regions 125 and 127 are displaced from the sidewall spacers 145. For example, the transistor S/D regions are non-self-aligned S/D regions. In one embodiment, the first and second S/D regions are displaced a distance away from an outer edge of the spacers. The displacement distance of the S/D regions from the edge of the gate may be about 0.1-0.5 μm. Other suitable displacement distances for the S/D regions may also be useful. The displacement distance may be varied depending on breakdown voltage and/or leakage current requirements. Displacing the drain region from the transistor gate suppresses gate-induced drain leakage (GIDL) current and improves gated breakdown voltage. Displacing both the first and second S/D regions allows symmetrical device to be formed and enables the source and drain terminals to be interchangeable/swappable during operations.

Although non-self-aligned S/D regions are described, it is to be understood that the transistor S/D regions may also be self-aligned S/D regions. In the case of self-aligned S/D regions, the first and second S/D regions are aligned to the spacers 145. For example, an inner edge of each S/D region is aligned to an outer edge of the dielectric spacer. Other configurations of S/D regions may also be useful.

A transistor S/D region may include a S/D extension region. The S/D extension region is, for example, a lightly doped diffusion (LDD) region. In one embodiment, LDD regions 120 and 122 are disposed in the substrate and extend beyond the S/D regions 125 and 127 to underlap a portion of the side gates. For example, the LDD regions and the side gates overlap, forming an overlap region. The overlap region should be sufficient so that the S/D regions are in communication with the channel of the transistor. For example, the length of the overlap region may be about 5-30% of gate length (Lgate). Other length for the overlap regions may also be useful.

In one embodiment, the LDD regions 120 and 122 are lightly doped with transistor type dopants. The LDD regions are, for example, lightly doped with first polarity type dopants for a first polarity type transistor. For example, the LDD regions are the same polarity type as the S/D regions. In one embodiment, the LDD regions are deep LDD regions having a depth deeper than the S/D regions. For example, the LDD regions encompass the S/D regions. The depth of the LDD region is, for example, about 0.2-1 μm from the substrate surface. Other suitable LDD depth dimensions may also be useful. By providing a deep LDD region, a highly graded LDD region is achieved and thus increases the breakdown voltage.

Metal silicide contacts 190 may be provided on contact regions of the device. The metal silicide contacts, for example, may be nickel or nickel-based metal silicide contacts. Other suitable types of metal silicide contacts, including cobalt or cobalt-based metal silicide contacts may also be useful. In one embodiment, silicide contacts are formed on the S/D regions. For example, silicide contacts are disposed on a portion of the transistor S/D regions and are away from edges of the S/D regions 125 and 127. This is to prevent silicide contacts from contacting the LDD regions. Metal silicide contacts may be provided at the gate contact pad (not shown) in communication with the HV gate electrode. Alternatively, silicide contacts may also be formed on the exposed top surface of the transistor gate and side gates. The silicide contacts of the different gates are separated by, for example, the non-planar top surface profile of the gates and/or the IPO layers. Other configurations of metal silicide contacts may also be useful.

A dielectric layer 192 is disposed over the substrate. It is understood that there may be additional layers between the dielectric layer and the substrate, such as an etch stop layer. The dielectric layer, for example, serves as a pre-metal dielectric (PMD) layer. The dielectric layer may be, for example, silicon oxide. Other types of dielectric layers which may serve as the PMD layer may also be used. Contact plugs or via plugs, such as tungsten plugs, may be disposed in the PMD layer. The contact plugs are in communication with the terminals or contact regions of the transistor. Additional dielectric layers (not shown) may be formed over the PMD layer. These additional dielectric layers include interconnects having contacts and conductive/metal lines (not shown) formed therein. The device may include multiple interconnect levels. The interconnects, for example, provide connections to the contact regions of the device.

In one embodiment, the first S/D region 125 is coupled to a metal line (not shown) having a first potential and the second S/D region 127 is coupled to another metal line (not shown) having a second potential through via plugs 182 and 184. For example, the first S/D region serves as a drain terminal and is coupled to a metal line having the first potential which is a relatively high potential, while the second S/D region serves as a source terminal and is coupled to the second potential which is a low potential. In one embodiment, the first or high potential may be about 0-50 V and the second or low potential may be ground or 0 V. The voltage values may vary, depending on the application of the HV transistor. Other configurations of the S/D regions may also be useful. For example, the source and drain terminals can be interchangeable.

The transistor gate 150 is coupled to a gate line (GL) of the device. In one embodiment, in the case where the transistor gate includes a single gate electrode, a via plug (not shown) may be disposed on the gate contact pad and coupled to a metal line having suitable gate potential. In another embodiment, in the case where the HV gate includes a HV gate stack as shown in FIG. 1a, a via plug (not shown) may extend through the top gate electrode 132 and inter-gate layer 135 to land on the bottom gate electrode 152. The via plug couples the bottom (or HV) gate electrode to the GL having suitable gate potential. This allows the HV gate to be biased at a voltage of about 0-50 V. It is understood that the HV gate may also be biased at other suitable voltage values.

The first and second side gates are coupled to suitable metal lines (not shown) through via plugs (not shown) which are disposed at far end of the side gates. In one embodiment, the first and second side gates are biased at suitable voltage values. The first and second side gates, in one embodiment, are biased at voltage values different from the HV gate. For example, the first and second side gates are biased at voltage values lower than that of the HV gate. Other suitable voltage values for the side gates may also be useful. The first side gate 160 which is disposed nearer to the drain region serves as a field plate gate (FPG). In one embodiment, the FPG which is biased at a lower potential relative to the HV gate reduces surface electric field, thereby improving the Vbr. The FPG, in one embodiment, is biased at a negative voltage in "off" state and positive voltage in "on" state. Such configuration improves both the Vbr and $R_{dson}$ of the HV device. The second side gate 170 which is disposed nearer to the source region serves as source side dual gate (SSDG). In one embodiment, the SSDG which is biased at a lower potential relative to the HV gate creates channel potential delta across the channel. This improves the carrier injection velocity, leading to a lower $R_{dson}$ which enhances the performance of the HV device.

In an alternative embodiment, the first and second side gates are not biased but left floating. Thus, when the HV gate is biased at a suitable potential, this potential will be coupled to the side gates through the IPO layer like a capacitor. Depending on the effectiveness of the coupling, a lower potential relative to the potential applied to the HV gate may effectively be induced or applied to the side gates. This creates channel potential delta across the channel and reduces the surface electric field.

Although a transistor having a primary gate between first and second secondary gates is described and shown with respect to FIG. 1a, it is to be understood that other transistor gate configurations may also be useful. FIGS. 1b and 1c show alternative embodiments of a device. The device shown in FIGS. 1b and 1c is similar to that described in FIG. 1a. Common elements and features having the same reference numerals may not be described or described in detail. In the interest of brevity, the description of the device shown in FIGS. 1b and 1c below primarily focuses on the difference(s) compared with the device shown in FIG. 1a.

In one embodiment, the gate configuration may also include an asymmetrical side gate configuration. As shown in FIG. 1b, the gate configuration may include an asymmetrical side gate 160 on the first side of the HV gate. For example, the second side gate 170 is not provided on the second side of the HV gate. This provides an asymmetrical first side gate configuration. In the case where the second side of the HV gate is devoid of a side gate, the second LDD region 122 extends under the IPO layer 136 to underlap a portion of the HV gate. The asymmetrical first side gate is, for example, in communication with the drain region. This provides a transistor having a FPG without a SSDG. Providing a FPG lowers the $R_{dson}$ and increases Vbr of the HV device.

In an alternative embodiment, the gate configuration includes only a second side gate 170 on the second side of the HV gate. For example, a first side gate 160 is not provided on the first side of the HV gate. This provides an asymmetrical second side gate configuration, as shown in FIG. 1c. In the case where the first side of the HV gate is devoid of a side gate, the first LDD region 120 extends under the IPO layer 136 to underlap a portion of the HV gate electrode 152. The asymmetrical second side gate is, for example, in communication with the source region. This provides a transistor having a SSDG without a FPG. Providing a SSDG improves $R_{dson}$ of the HV device.

Figure 2:
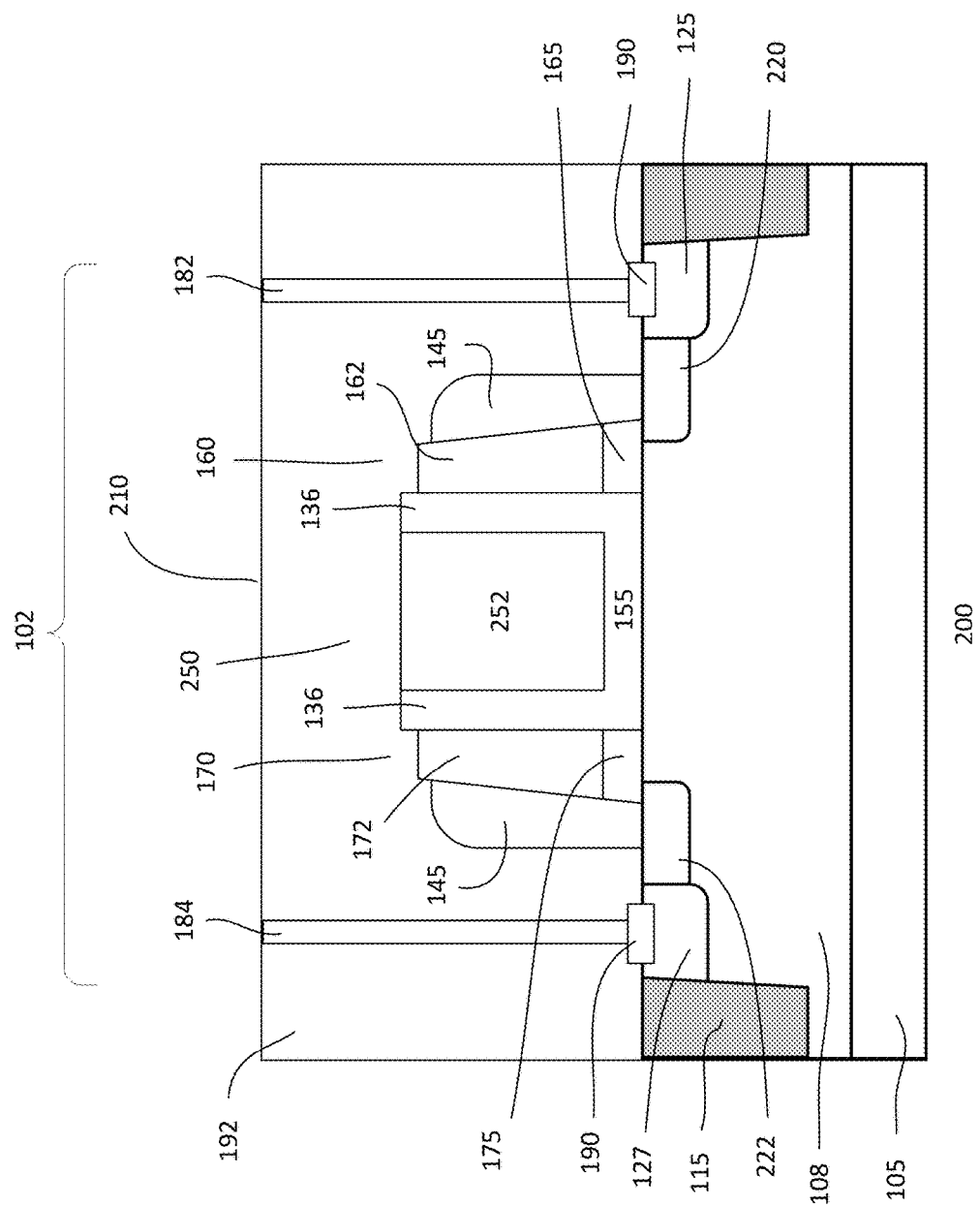
FIG. 2 shows a cross-sectional view of another embodiment of a device.

FIG. 2 shows a cross-sectional view of another embodiment of a device 200. The device is similar to that described in FIGS. 1a-1c. Common elements and features having the same reference numerals may not be described or described in detail. In the interest of brevity, the description of the device shown in FIG. 2 below primarily focuses on the difference(s) compared with the device shown in FIG. 1a.

The HV device 200, in one embodiment, includes a metal oxide semiconductor (MOS) transistor 210. The transistor is disposed in the device region 102. The transistor includes a transistor gate 250 disposed between first and second side gates 160 and 170. In one embodiment, first and second S/D regions 125 and 127 are disposed in the substrate adjacent to the first and second side gates. The transistor gate may serve as a HV gate. The first side gate is disposed adjacent to the first side of the HV gate while the second side gate is disposed adjacent to a second side of the HV gate. Other configurations of the different gates may also be useful. For example, an asymmetrical side gate may be disposed on the first or second side of the HV gate 250 such as that shown in FIGS. 1b and 1c.

In one embodiment, the HV gate includes a polysilicon gate electrode 252 over a gate dielectric 155. The gate electrode 252 serves as a HV gate electrode and the gate dielectric layer 155 serves as a HV gate dielectric. The first and second side gates 160 and 170 include gate electrode layers 162 and 172 over gate dielectric layers 165 and 175 respectively.

The transistor S/D regions include LDD regions 220 and 222. The LDD regions, for example, extend beyond the S/D regions 125 and 127 to underlap a portion of the side gates 160 and 170. In one embodiment, the LDD regions are shallow LDD regions. For example, the LDD regions have a depth shallower than the S/D regions. The LDD regions, for example, have a depth of about 0.05-0.2 µm from the substrate surface. Other suitable depth dimensions of the LDD regions may also be useful.

Metal silicide contacts 190 may be provided on contact regions of the device, such as the first and second S/D regions. The first S/D region serves as a drain terminal and the second S/D region serves as a source terminal. Other configurations of S/D regions may also be useful. The first side gate serves as a FPG and the second side gate serves as a SSDG. Providing a FPG and SSDG lowers the $R_{dson}$ and increases Vbr of the device.

Figure 3A:
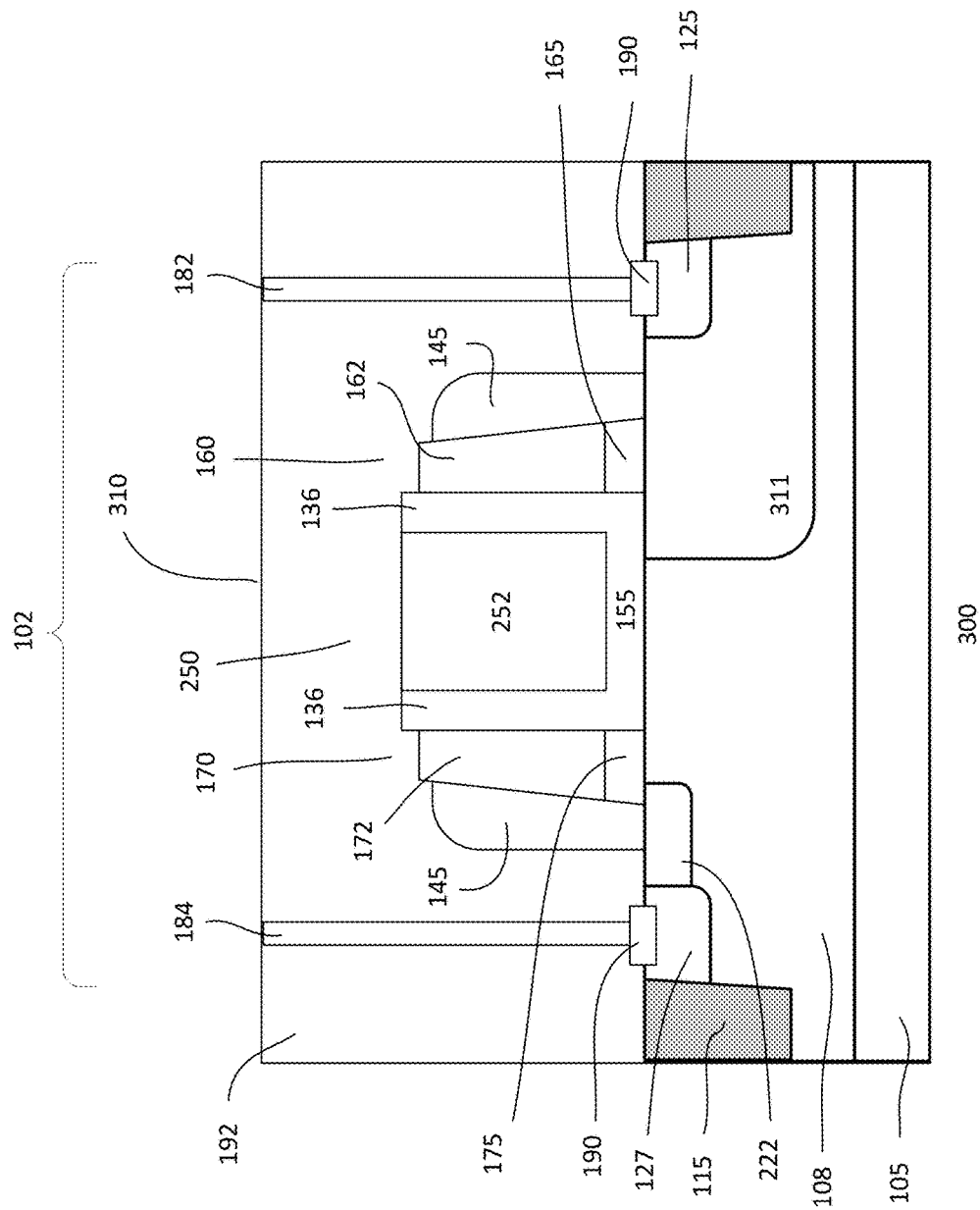
FIGS. 3a-3b show cross-sectional views of other embodiments of a device.
Figure 3B:
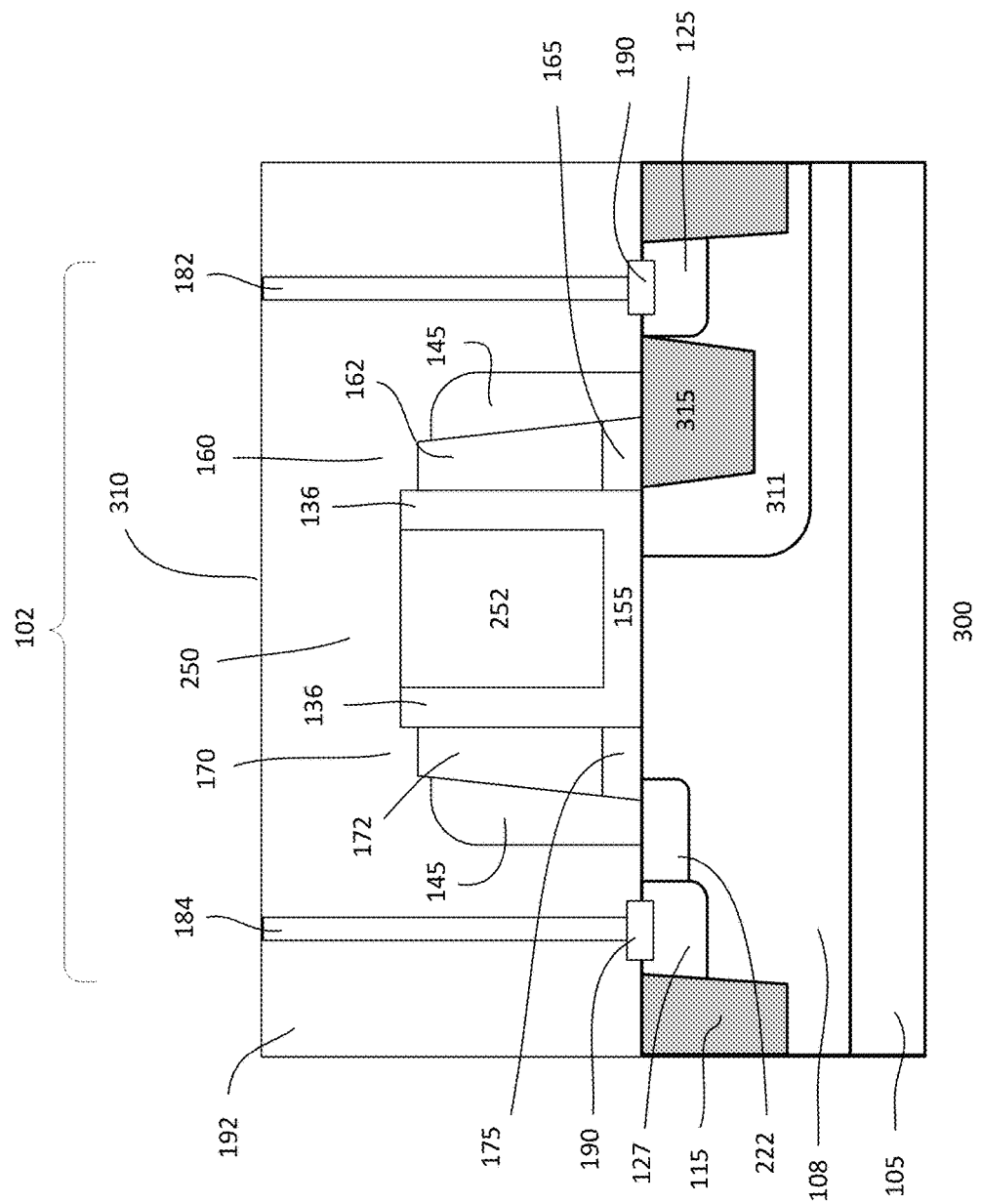

FIGS. 3a-3b show cross-sectional views of other embodiments of a device 300. The device is similar to that described in FIGS. 1a-1c and FIG. 2. Common elements and features having the same reference numerals may not be described or described in detail. In the interest of brevity, the description of the device shown in FIGS. 3a-3b below primarily focuses on the difference(s) compared with the device shown in FIG. 1a and FIG. 2.

The HV device 300, in one embodiment, includes a laterally diffused metal oxide semiconductor (LDMOS) transistor 310. The transistor 310 is disposed in the device region 102. The transistor includes a transistor gate 250 disposed between first and second side gates 160 and 170. In one embodiment, first and second S/D regions 125 and 127 are disposed in the substrate adjacent to the first and second side gates. The transistor gate may serve as a HV gate. The first side gate is disposed adjacent to the first side of the HV gate while the second side gate is disposed adjacent to a second side of the HV gate. Other configurations of the different gates may also be useful. For example, an asymmetrical side gate may be disposed on the first or second side of the HV gate such as that shown in FIGS. 1b and 1c.

In one embodiment, the first S/D region 125 is not provided with a S/D extension region. For example, the source region includes a LDD region 222 while the drain region 125 is devoid of a LDD region. The transistor 310 includes, for example, an asymmetrical LDD region.

In one embodiment, a doped region 311 is provided in the substrate within the device well 108. The doped region, for example, serves as a drift region of the device. As shown in FIG. 3a, the drift region is disposed adjacent to the HV gate 250 on the first side of the transistor 310. In one embodiment, the drift region encompasses the first S/D region and underlaps a portion of the HV gate 250. The drift region, for example, extends under the first side gate and underlaps a portion of the HV gate electrode 252.

In one embodiment, the drift region 311 is doped with transistor type dopants. For example, the drift region is doped with first polarity type dopants for a first polarity type transistor. The first polarity type may be n-type for a n-type transistor or p-type for a p-type transistor. An n-type drift region, for example, may include phosphorus dopants. The drift region may be lightly or intermediately doped. For example, the dopant concentration of the drift region may be about $1E16-1E18/cm^3$. Other dopant concentrations may also be useful. The dopant concentration may depend on, for example, the maximum voltage requirement of the device. The drift region 311 may have a depth deeper than the isolation region 115. For example, the drift region extends below and underlaps a portion of the isolation region. The depth of the drift region is, for example, about 0.2-1 µm. Other suitable depth dimensions for the drift region may also be useful.

The first side gate 160, for example, serves as a FPG. The presence of the FPG and the drift region 311 further reduces surface electric field, allowing high breakdown voltage and low $R_{dson}$ to be obtained.

In an alternative embodiment, an internal isolation region 315 may be provided in the device region within the drift region 311, as shown in FIG. 3b. The internal isolation region is, for example, a STI region. Other types of internal isolation regions may also be employed. Preferably, the internal isolation region is the same type of isolation region as the device isolation region 115. Providing an internal isolation region which is different from the device isolation region may also be useful. The internal isolation region is, for example, disposed along a gate length direction between the HV gate and first S/D region 125. The internal isolation region, for example, includes a length extending from one side to the other side of the device region along the gate length direction. Other configurations of the device and internal isolation region may also be useful.

As shown, the internal isolation region 315 is positioned below the first side gate 160. In one embodiment, the internal isolation region includes a width extending from about an inner edge of the first S/D region 125 to about an inner edge of the first side gate electrode 162. The width of the internal isolation region, for example, may be about 0.1-1 µm. Other widths of the internal isolation region may also be useful, depending on the drain voltage. The depth of the internal isolation region may be about 1000-5000 Å from the substrate surface. Although the internal and device isolation regions are shown as having different depths, it is understood that the internal and device isolation regions may have substantially the same depth. The width and depth of the internal isolation region may determine a drift length of the transistor.

Providing the internal isolation region below and underlapping the first side gate protects an edge of the side gate dielectric 165 from high electric field during operation. The internal isolation region also increases the drift distance of the transistor. The presence of the FPG, the drift region and the internal isolation region further reduces electric field, allowing higher breakdown voltage and lower $R_{dson}$ to be obtained.

Metal silicide contacts 190 may be provided on contact regions of the device 300, such as the first and second S/D regions. The first S/D region serves as a drain terminal and the second S/D region serves as a source terminal. Other configurations of S/D regions may also be useful. In one embodiment, the first side gate is in communication with the drain terminal and the second side gate is in communication with the source terminal. The first side gate serves as the FPG and the second side gate serves as the SSDG.

Figure 4:
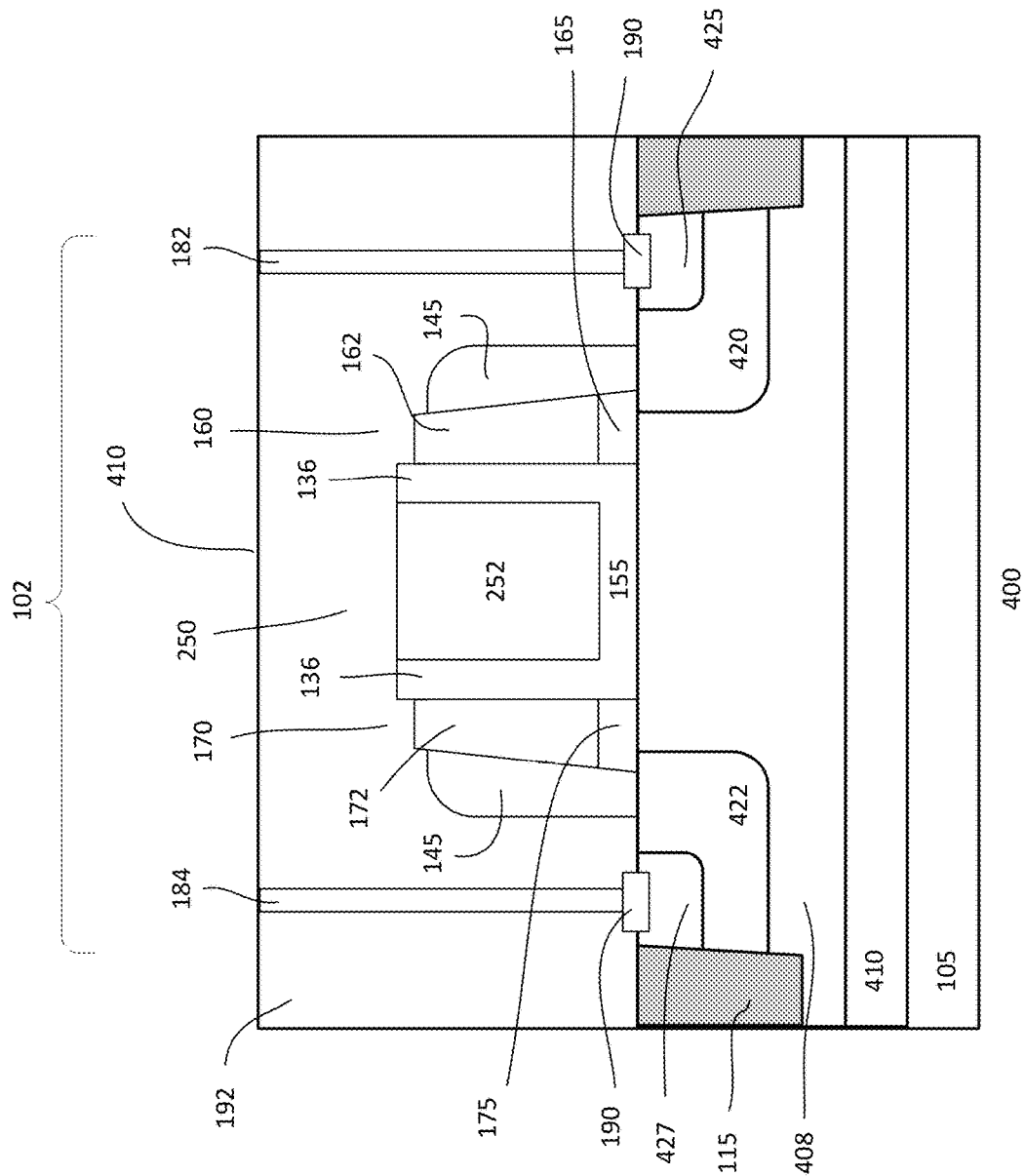
FIG. 4 shows a cross-sectional view of another embodiment of a device.

FIG. 4 shows cross-sectional view of another embodiment of a device 400. The device is similar to that described in FIGS. 1a-1c, FIG. 2 and FIGS. 3a-3b. Common elements and features having the same reference numerals may not be described or described in detail. In the interest of brevity, the description of the device shown in FIG. 4 below primarily focuses on the difference(s) compared with the device shown in FIG. 1a.

The HV device 400, in one embodiment, includes a vertically diffused metal oxide semiconductor (VDMOS) transistor 410. The transistor is disposed in the device region 102. The transistor includes a transistor gate 250 disposed between first and second side gates 160 and 170. In one embodiment, first and second S/D regions 425 and 427 are disposed in the substrate adjacent to the first and second side gates. The transistor gate may serve as a HV gate. The first side gate is disposed adjacent to the first side of the HV gate while the second side gate is disposed adjacent to a second side of the HV gate. Other configurations of the different gates may also be useful.

First and second doped regions 420 and 422 are disposed in the substrate within the device region. The first and second doped regions are disposed adjacent to first and second side gates. For example, the first doped region encompasses the first S/D region 425 and the second doped region encompasses the second S/D region 427. In one embodiment, the doped regions 420 and 422 include second polarity type dopants while the first and second S/D regions 425 and 427 include same polarity type dopants and concentration as S/D regions 125 and 127. The second polarity type is, for example, an opposite polarity type to the transistor type dopants. In one embodiment, the first and second doped regions are lightly doped with second polarity type dopants for a first polarity type transistor. For example, the second polarity type may be p-type for a n-type transistor. Other configurations of transistor and doped regions may also be useful. For example, the second polarity type may be n-type and the first polarity type may be p-type. The dopant concentration of the doped regions may be about 1E17-1E19/cm$^3$. Providing other dopant concentrations for the doped region may also be useful. In one embodiment, the doped regions include a depth shallower than the isolation region 115. The depth of the doped regions is, for example, about 0.1-0.5 µm. Providing other depth dimensions for the doped regions may also be useful.

In one embodiment, the first and second doped regions 420 and 422 extend beyond the S/D regions 425 and 427 to underlap a portion of the first and second side gates 160 and 170. For example, the first and second doped regions and the side gates overlap, forming an overlap region. The overlap region should include a suitable length for sufficient gate control. For example, the length of the overlap region may be about 10-50% of Lgate. Other length of overlap region may also be useful.

A device well 408 may be disposed in the substrate within the device region. In one embodiment, the device well encompasses the first and second doped regions as well as the S/D regions. For example, the device well surrounds the doped regions. The device well 408 has a depth deeper than the doped regions 420 and 422. A depth of the device well is, for example, about 0.3-5 µm from the substrate surface. Other suitable depth dimensions for the device well may also be useful. The device well is lightly doped with transistor type dopants. For example, the dopant concentration of the device well is about 1E15-1E18/cm$^3$. Providing a device well with other dopant concentrations may also be useful.

A buried layer 410 may be provided in the substrate within the device region. For example, the buried layer is disposed below the device well 408. The depth of the buried layer is, for example, about 1-5 µm. Other depth dimensions for the buried layer may also be useful. In one embodiment, the buried layer is heavily doped with transistor type dopants. The dopant concentration of the buried layer is, for example, about 1E19-1E21/cm$^3$. Other dopant concentrations may also be useful. The buried layer serves as a third S/D region, such as a buried S/D layer or region.

In one embodiment, the first and second S/D regions 425 and 427 serve as source regions/terminals and the buried S/D region 410 serves as a drain region/terminal of the device. For example, the first and second S/D regions 425 and 427 are coupled to a metal line (not shown) having a first potential through via plugs 182 and 184 and the buried S/D layer 410 is coupled to another metal line (not shown) having a second potential through via plug (not shown). The drain terminal is coupled to a metal line having the second potential which is a relatively high potential while the source terminals are coupled to the first potential which is a low potential. Other configurations of S/D regions and metal lines may also be useful. For example, the source and drain terminals can be interchangeable. In the case where the first and second S/D regions serve as source regions, the first and second side gates 160 and 170 serve as source side dual gates (SSDGs). This device configuration lowers $R_{dson}$ of the HV device.

In an alternative embodiment, the first and second S/D regions 425 and 427 may serve as drain regions/terminals and the buried S/D region 410 may serve as a source region/terminal of the device. For example, the drain terminals are coupled to a metal line having the second potential which is a relatively high potential while the source terminal is coupled to the first potential which is a low potential. In this case, the first and second side gates serve as field plate gates (FPGs). This device configuration improves both the $R_{dson}$ and Vbr of the HV device.

FIGS. 5a-5j show cross-sectional views of an embodiment of a process 500 for forming a device. The device is, for example, an IC. Other types of devices may also be useful. The device formed by process 500 is the same as that shown in FIG. 1a. As such, in the interest of brevity, common elements and features having the same reference numerals may not be described or described in detail.

Referring to FIG. 5a, a substrate 105 is provided. The substrate can include a silicon substrate, such as lightly p-type doped substrate. N-type or other types of substrates, including silicon germanium, germanium, gallium arsenide, or SOI, are also useful. Providing a substrate with other types of dopants or dopant concentrations as well as an undoped substrate, may also be useful.

The substrate 105 is prepared with a device region 102. The device region, in one embodiment, serves as a device region for a transistor, such as a HV transistor. The substrate is prepared with a device isolation region 115. The isolation region, for example, includes a STI region which isolates the device region from other regions.

Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI. The isolation region may also be other types of isolation regions.

As shown, the substrate includes one device region. It is understood that the substrate may include a plurality of device regions (not shown) which accommodate other suitable types of devices, including but not limited to LV, MV and memory devices.

Referring to FIG. 5b, the substrate is prepared with a device well 108 in the device region. The device well may be formed by ion implantations. To form the device well, an implant mask (not shown) which exposes the device region is used. The implant mask, for example, is a photoresist layer patterned by a lithographic mask. The implant introduces dopants into the substrate exposed by the implant mask. In some instances, depending on the depth, multiple implants may be performed to form the device well.

In one embodiment, the device well is doped with second polarity dopants. For example, the device well is doped with p-type dopants for a n-type HV transistor. Alternatively, the second polarity dopants may be n-type for a p-type HV transistor. The device well serves as a body for the transistor. A depth of the device well may be about 0.1-5 µm. Other depths for the device well may also be useful. The dopant concentration of the device well may be light to intermediate. For example, the dopant concentration of the device well may be about $1E14$-$1E18/cm^3$. Other dopant concentrations for the device well may also be useful. The implant mask may also expose other device regions for same polarity type wells (not shown). Another implant may be performed using another mask to expose device regions for opposite polarity type device wells (not shown).

Figure 5C:
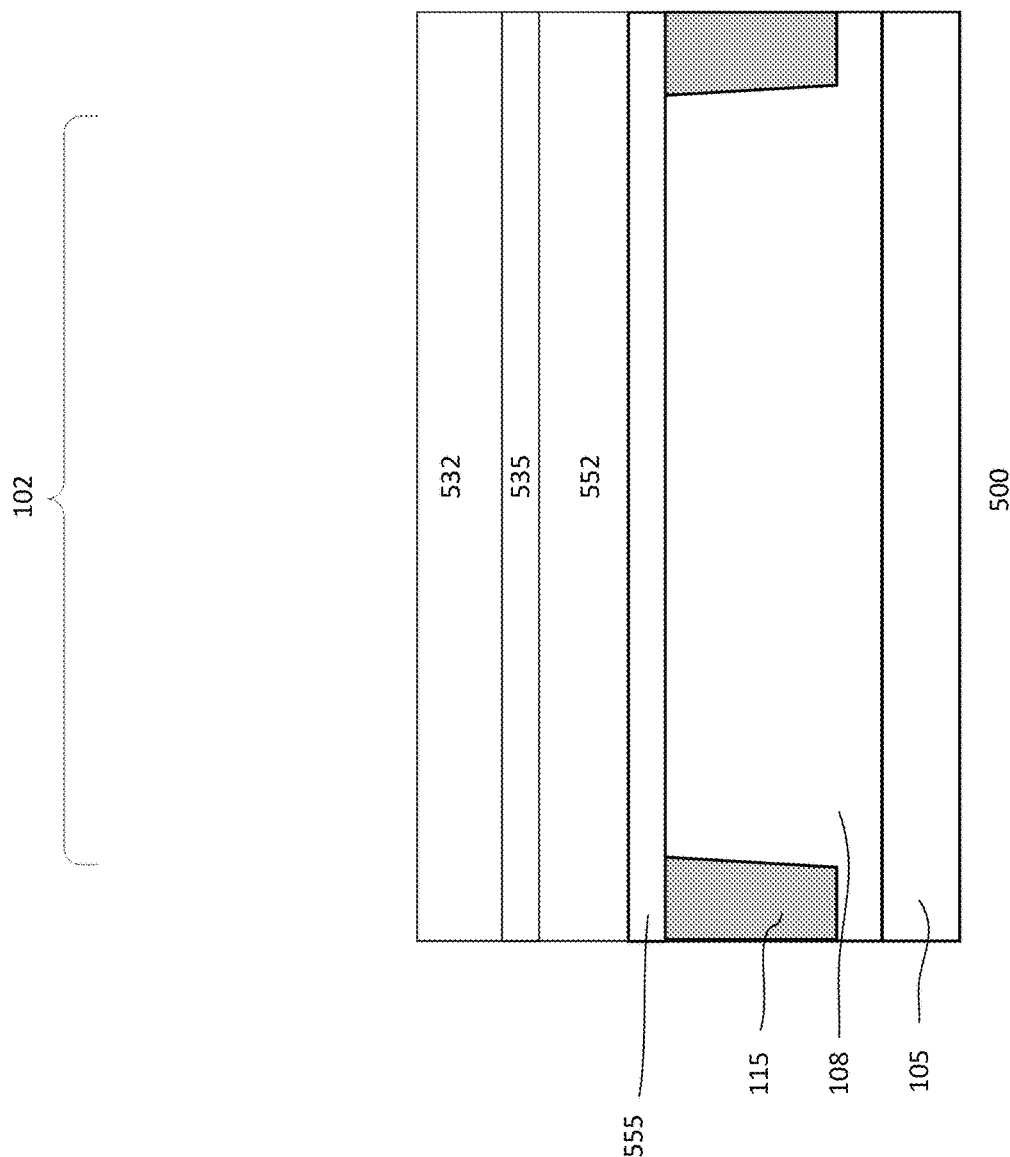

Referring to FIG. 5c, the process continues to form gate layers. In one embodiment, the gate layers include a gate dielectric layer and a gate electrode layer formed thereon. For example, a gate dielectric layer 555 is formed on the surface of the substrate. The gate dielectric layer, for example, is a silicon oxide layer. The gate dielectric layer may be formed by thermal oxidation. The gate dielectric layer, for example, may be a thick gate dielectric layer having a thickness of about 50-300 Å. Other types of gate dielectric materials, thickness dimensions and forming techniques may also be useful. For example, the gate dielectric layer may be formed by other suitable types of processes, such as chemical vapor deposition (CVD), high temperature oxidation (HTO) process or in-situ steam generation (ISSG) process.

A gate electrode layer may be deposited on the gate dielectric layer 555. The gate electrode layer, for example, includes polysilicon. Other suitable types of gate electrode materials may also be useful. The thickness of the gate electrode layer may be about 400-1200 Å. Other thicknesses may also be useful. Furthermore, the gate electrode may be doped with dopants, such as transistor type dopants. Doping the gate electrode with other dopant types may also be useful. The gate electrode layer may be formed by, for example, CVD. The gate electrode layer can be formed as an amorphous or non-amorphous layer. In the case of an amorphous layer, subsequent thermal processes may crystallize the amorphous layer to form a polycrystalline silicon gate electrode layer. Other configurations of gate dielectric and gate electrode layers may also be useful.

In another embodiment, the gate layers may be formed as part of the process for forming various gate layers for split-gate NVM device. In such case, the various gate layers may include a gate stack. For example, the process includes forming the gate dielectric layer 555 on the substrate and forming a gate stack on the gate dielectric layer. The gate stack, for example, includes bottom and top polysilicon gate electrode layers 552 and 532 separated by an inter-gate layer 535 as shown in FIG. 5c. In one embodiment, the inter-gate layer 535 is deposited on the bottom gate electrode layer 552 and a top gate electrode layer 532 is deposited on the inter-gate layer 535. For example, the bottom gate electrode layer may be the same as the gate layer for forming floating gate, the inter-gate layer may be a dielectric stack, such as ONO stack, while the top gate electrode layer may be the same as the gate layer for forming control gate of the split-gate NVM device. The various gate layers, for example, may be formed by CVD. Other suitable materials and forming techniques may also be useful.

Figure 5D:
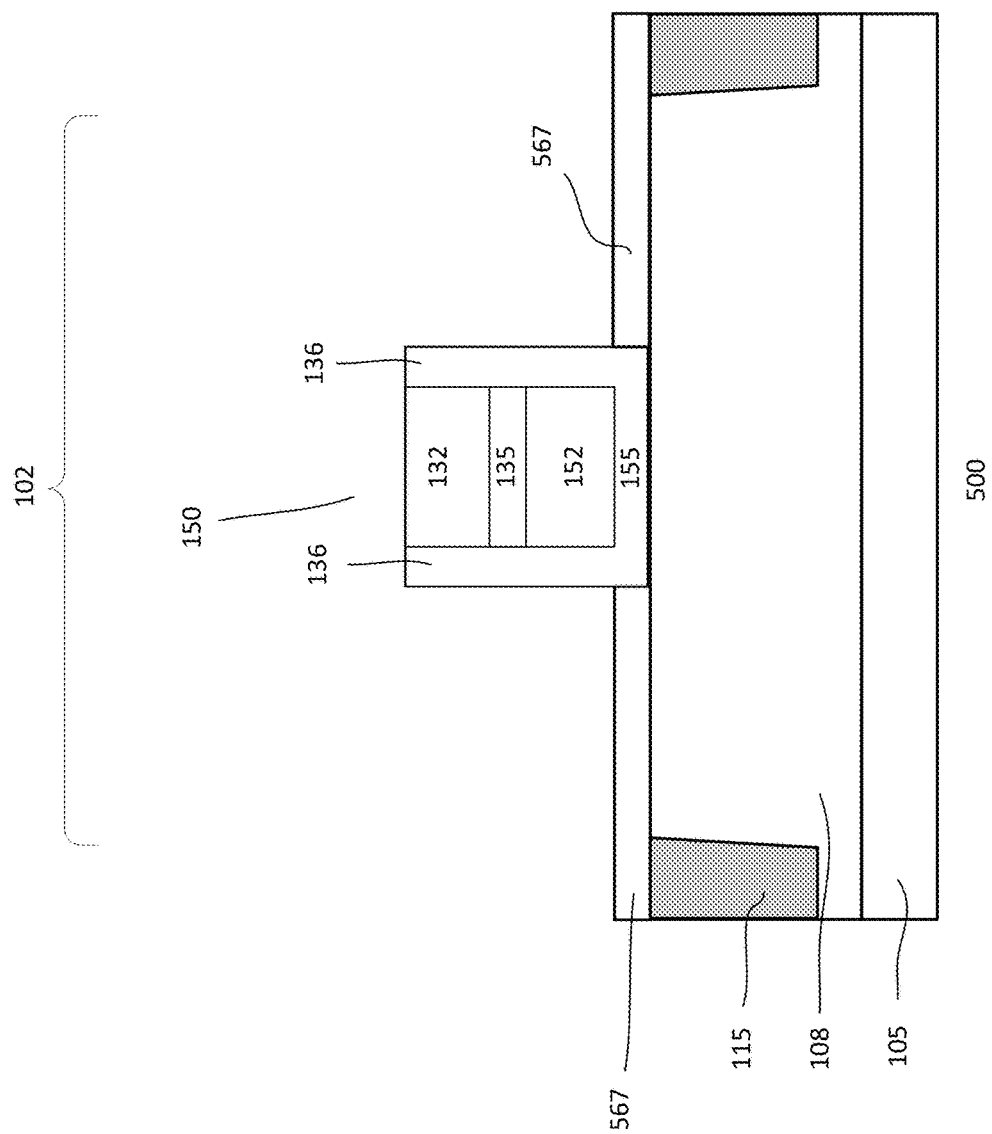

Referring to FIG. 5d, the various gate layers are patterned to form an upper portion of the device gate. For example, the top and bottom gate electrode layers and inter-gate layer are patterned to form the gate stack of a HV gate or primary gate 150. A mask (not shown) may be employed to pattern the gate and inter-gate layers. For example, a soft mask, such as a photoresist layer, may be used. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating (ARC) may be used below the photoresist layer.

An anisotropic etch, such as reactive ion etching (RIE), is performed using the mask to pattern the gate layers to define the gate stack having top electrode 132, inter-gate layer 135 and bottom electrode 152. Other suitable types of mask and/or etch processes may also be useful. The gate electrode, for example, may be a gate electrode conductor. Other configurations of the gate electrode may also be useful. The etch, for example, may partially or completely remove portions of the gate dielectric layer 555 not shielded by the patterned gate stack 150. Thus, the portion of the gate dielectric layer adjacent to the patterned gate stack may have a thickness which is less than the thickness of the portion of the gate dielectric layer underlapping the HV gate stack.

Referring to FIG. 5d, the process continues to form an oxide layer. In one embodiment, a sidewall oxidation process followed by a high temperature oxidation (HTO) deposition process are performed to form the oxide layer. Other suitable techniques and dielectric materials may also be used to form the oxide layer. An etch process may be performed to remove portion of the oxide layer over the gate stack 150 while leaving vertical portions on sidewalls of the gate stack to serve as inter-poly dielectric layers 136 and horizontal portions over the substrate adjacent to the patterned gate stack to serve as side gate dielectric layer 567.

Figure 5F:
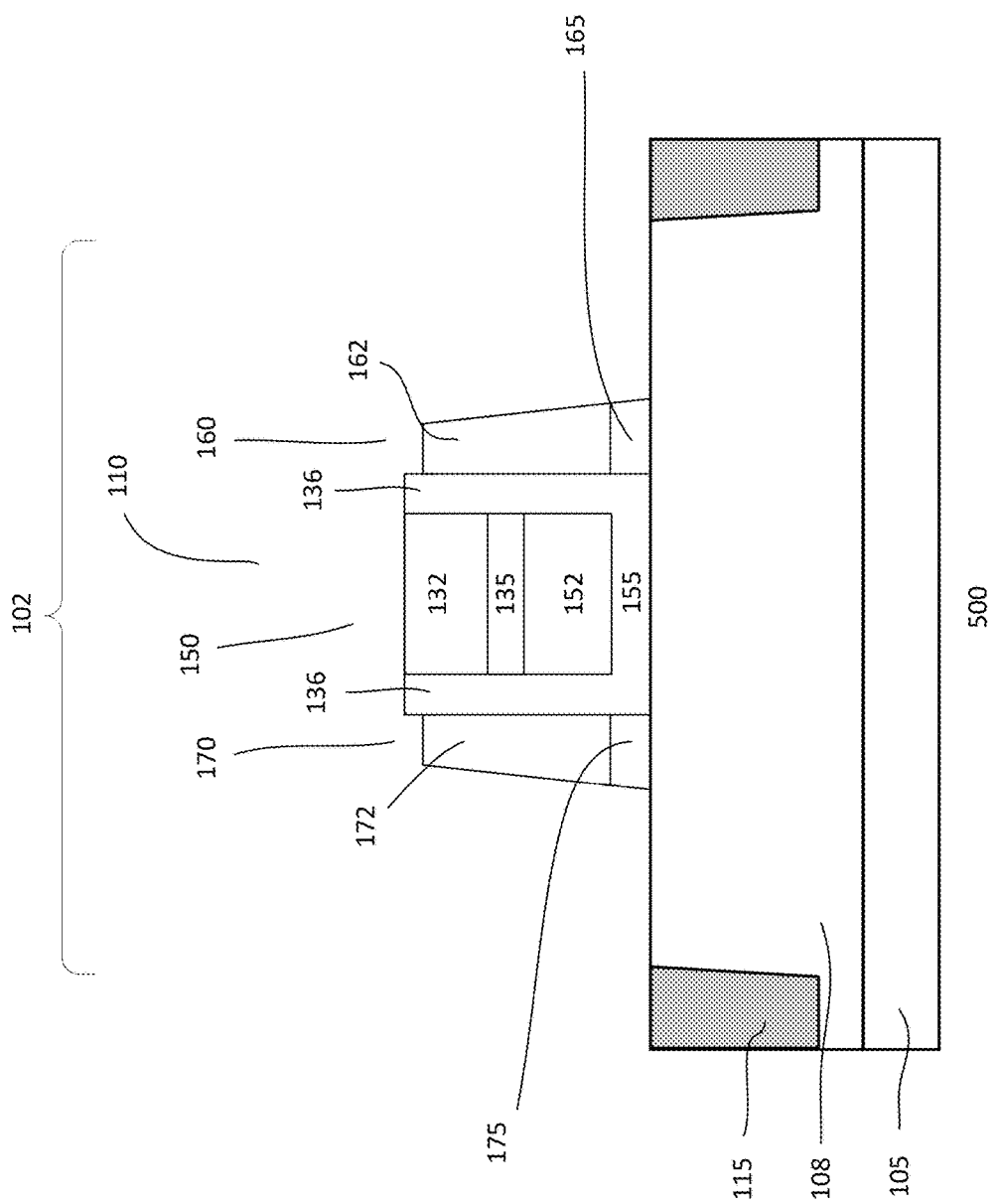

The process continues to form secondary or side gate(s). Various techniques may be employed to form the secondary or side gate(s). In one example, a gate electrode layer 540 is conformally formed on the substrate over the exposed side gate dielectric layer 567, HV gate 150 and inter-poly dielectric layers 136 as shown in FIG. 5e. The gate electrode layer, for example, includes polysilicon and may be formed by, for example, CVD. Other suitable materials and forming techniques may also be useful. A dielectric layer (not shown), such as tetraethyl orthosilicate (TEOS), is formed over the gate electrode layer 540 by CVD. An etch, such as RIE, is performed to define the first and second secondary or side gates 162 and 172, as shown in FIG. 5f. This results in first and second side gates formed in the form of gate spacer with slanted sidewalls. The etch may also be configured to define the gate dielectric 165 and 175 of the side gates by removing exposed portions of the underlying side gate dielectric layer 567.

Although side gates having slanted outer sidewall profile or spacer profile are shown, it is to be appreciated that the first and second side gates may include other suitable profiles. For example, other methods of forming the first and second side gates may result in side gates having substantially vertical sidewall profiles. Furthermore, depending on the process, the side gates may have top surfaces which are substantially coplanar with top surface of the HV gate.

For example, in an alternative embodiment, forming the first and second side gates may include depositing a gate electrode layer and performing a chemical mechanical polishing (CMP) process to remove and planarize the gate electrode layer such that the side gates have substantially coplanar top surfaces with the top surface of the HV gate 150 and inter-poly dielectric layers 136. A patterning process which includes mask and etch techniques may then be performed to define the first and second side gates 160 and 170 adjacent to the first and second sides of the HV gate 150. This may result in side gates having substantially vertical sidewall profile.

In another embodiment, the first and second side gates may be formed together with the split-gate NVM process where the side gates are formed as part of the process for forming select gates of the NVM device. Forming the side gates independently may also be useful.

Figure 5G:
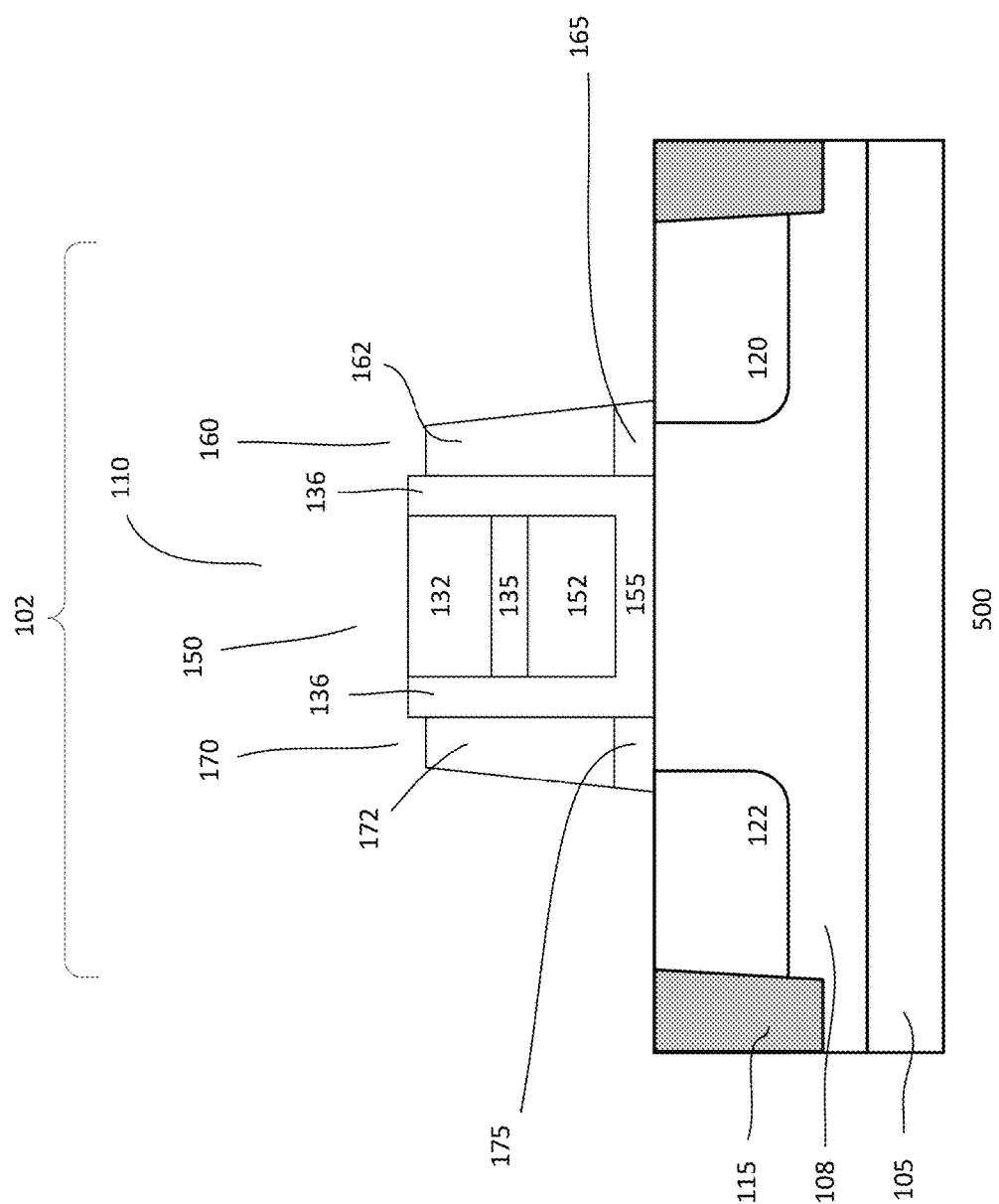

Referring to FIG. 5g, lightly doped regions are formed in exposed portions of the substrate. The lightly doped regions are, for example, LDD regions 120 and 122. To form the LDD regions, transistor type dopants are implanted into the substrate. The implant, for example, may be self-aligned with respect to the device region. For example, the dopants may be introduced into the substrate unprotected by the first and second side gates and device isolation region. In one embodiment, the LDD region is a deep lightly doped region. For example, the LDD regions are implanted to a depth of about 0.2-1 µm. Other LDD depth dimensions may also be useful. Suitable implant parameters may be used to form the LDD regions, depending on implant species and junction requirements. The LDD regions 120 and 122 may underlap the first and second side gates. For example, dopant diffusion due to subsequent thermal processes, such as rapid thermal annealing (RTA) to activate the dopants extends the LDD dopants under the side gates.

Figure 5H:
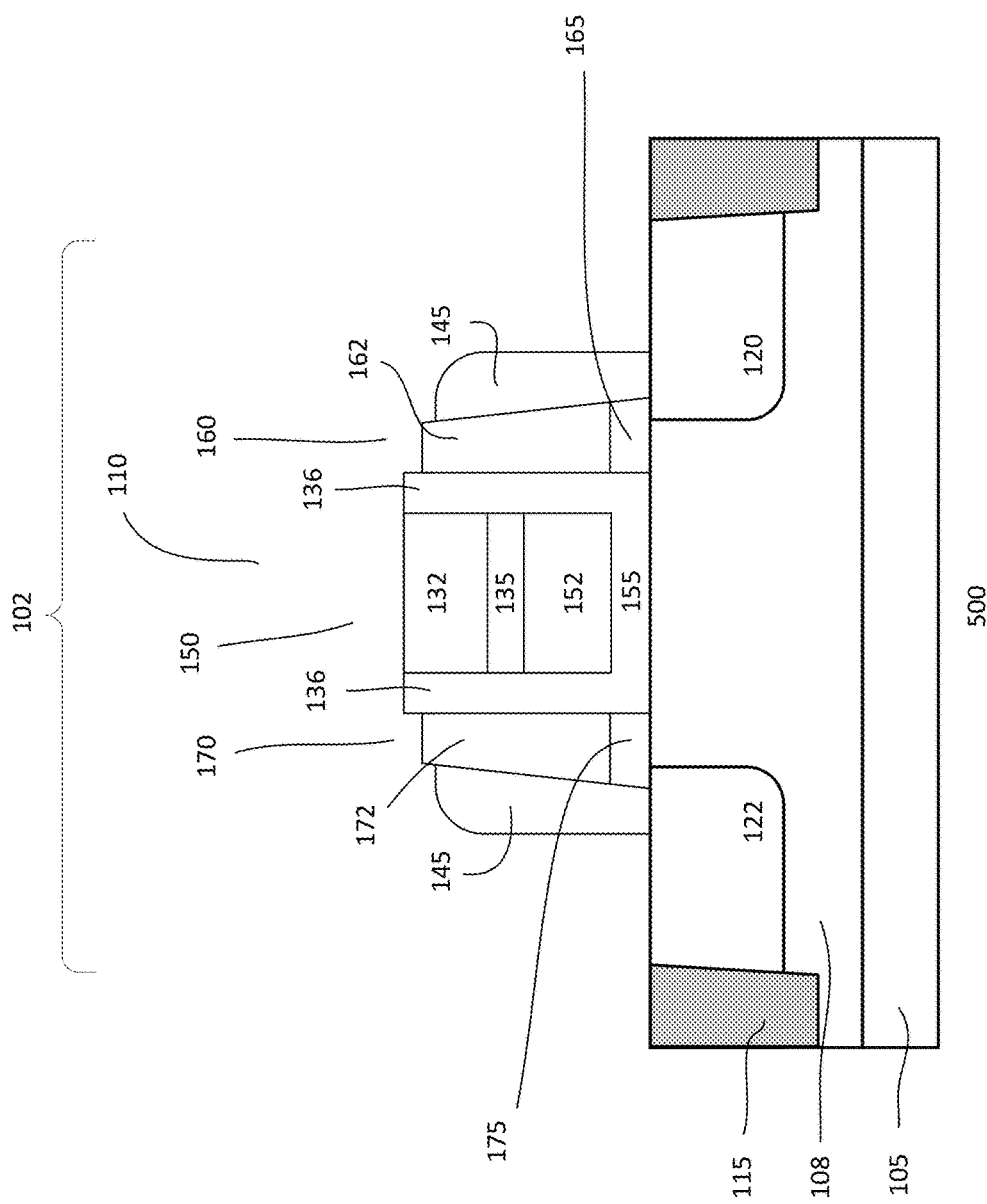

Referring to FIG. 5h, sidewall spacers 145 may be formed on the sidewalls of the gate structure. In one embodiment, a spacer dielectric layer is deposited over the substrate. The spacer dielectric layer can be formed by using various techniques, such as plasma enhanced chemical vapor deposition (PECVD). Other techniques to form the spacer dielectric layer are also useful. The spacer dielectric layer is anisotropically etched, such as by RIE, to remove horizontal portions, leaving non-horizontal portions on sidewalls as spacers. The thickness of the spacers may be, for example, about 20-100 nm. Other spacer thicknesses may also be useful.

First and second S/D regions 125 and 127 are formed in the source and drain regions in the substrate. The S/D regions include transistor type dopants. In one embodiment, the S/D regions are formed by ion implantation. The implant, like the one that forms the LDD regions, is self-aligned with respect to the device region. For example, the implant is used to introduce dopants into the substrate portion unprotected by the first and second side gates, spacers and device isolation regions. The implant parameters are selected to form the S/D regions to a depth shallower than that of the LDD regions and isolation region 115. Suitable implant parameters may be used to form the S/D regions, depending on implant species and junction requirements. Furthermore, dopants from the implant should not penetrate the different gate electrodes. An anneal is performed to diffuse and activate the dopants.

Figure 5I:
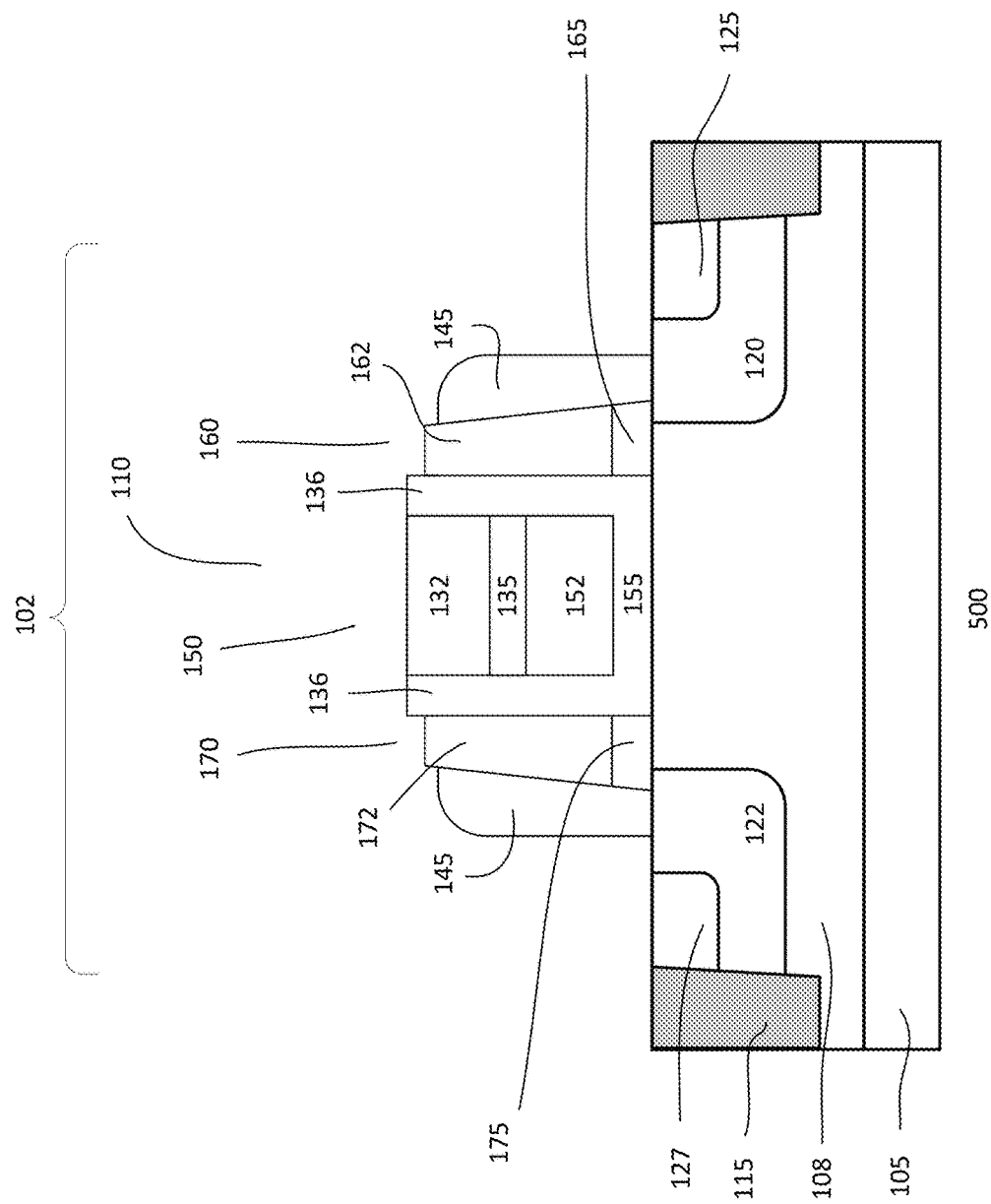

In another embodiment, the first and second S/D regions 125 and 127 are displaced a distance from the spacers to form non-self-aligned S/D regions as shown in FIG. 5i. For example, an implant mask may be used to offset the first and second S/D regions a distance from the dielectric spacers 145 during implantation. The implant mask may be a photoresist mask. Other types of masks may also be useful. Other techniques for forming the non-self-aligned S/D regions may also be useful.

Figure 5J:
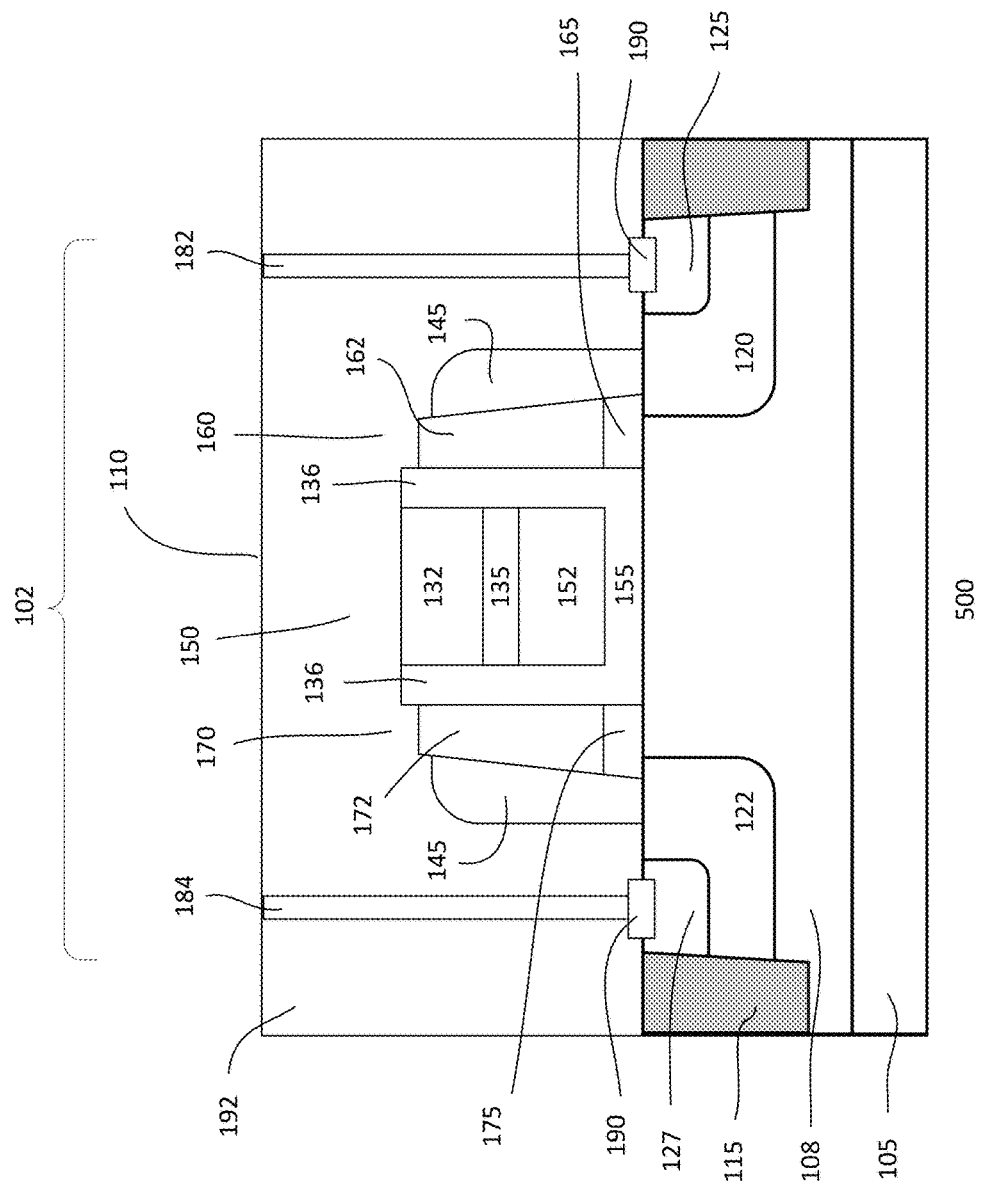

Referring to FIG. 5j, the process continues to form the device as shown in FIG. 1a. For example, the process may continue to form metal silicide contacts and contacts or via plugs. As shown, silicide contacts 190 are formed on contact regions of the transistor. For example, the silicide contacts are formed on the first and second S/D regions 125 and 127 and gate contact pad (not shown) which is coupled to the HV gate of the transistor. The silicide contacts are to facilitate low resistance contacts between the active substrate and the back end of line (BEOL) metal lines. In one embodiment, the thickness of the silicide contacts is about 50-300 Å. Providing other thicknesses may also be useful. To form the silicide contacts, a metal layer is deposited on the substrate. The metal layer, for example, may be cobalt or an alloy thereof. Other types of metallic layers, such as nickel, or alloys thereof, may also be used. The metal layer can be formed by physical vapor deposition (PVD). Other types of metal layers that can be formed by other types of processes can also be used.

In one embodiment, silicide blocks may be employed to protect device regions from silicidation. For example, a silicide block may wrap around the gate structure and extend over the substrate to overlap a portion of the S/D regions and exposed LDD regions, preventing these areas from silicidation later.

A first anneal may be performed. The first anneal diffuses the metal dopants into the active substrate, forming a silicide layer. Excess metal not used in the silicidation of the active surface is removed by, for example, a wet removal process. For example, unreacted metal material is removed selective to the silicide contacts. A second anneal may be performed to enhance the material properties of the silicide layer, for example, lower resistivity. RTA may be employed for the first and second annealing processes. Other techniques may also be used to form the silicide contacts 190.

A dielectric layer 192 may be formed on the substrate, covering the transistor. The dielectric layer, in one embodiment, serves as a PMD layer. The dielectric layer, for example, is a silicon oxide layer. Other types of dielectric materials are also useful. The dielectric layer may be formed by, for example, CVD. Other techniques may also be employed to form the dielectric layer.

Contacts or via plugs may be formed in the PMD layer. The contacts plugs, for example, are coupled to contact regions of the transistor. For example, contact plugs 182 and 184 are formed to couple the first and second S/D regions 125 and 127 to metal lines (not shown) and contact plugs are formed to couple the HV gates and side gates to respective metal lines (not shown) disposed over the PMD layer. The contact plugs may be formed using a single damascene process. For example, via openings are formed in the PMD layer using, mask and etch processes, such as RIE. The via opening which couples to the HV gate, for example, may be formed in the PMD layer and extends downwardly through the top electrode layer 132 and inter-gate layer 135. For example, the via opening exposes a top surface portion of the bottom or HV gate electrode for contact plug formation. The via openings are filled with a conductive material, such as tungsten. Other types of conductive materials may also be useful. Excess conductive material is removed by, for example, CMP to form contact plugs with planar surfaces with the PMD layer.

After the contact plugs are formed, an interlevel dielectric (ILD) layer (not shown) may be formed over the PMD layer. Trenches are formed in the ILD layer using mask and etch processes. The trenches correspond to metal lines or conductive lines which are in communication with the contact plugs in the PMD layer. The trenches are filled with a conductive material, such as copper of copper alloy. Other types of conductive materials may also be useful. Excess conductive materials are removed by, for example, CMP to provide a coplanar top surface with exposed interconnect lines. Other techniques for forming the conductive lines and plugs as well as the use of other types of conductive materials may also be useful. For example, RIE techniques may also be used or a combination of RIE and damascene techniques may also be useful.

Additional processes may be performed to complete the device. Such processes may include forming additional interconnect metal levels, final passivation, dicing, packaging and testing.

The process as described in FIGS. 5a-5j, for example, forms the device shown in FIG. 1a. It is understood that modifications may be made to the process of FIGS. 5a-5j to form the device shown in FIGS. 1b-1c. For example, suitable mask and etch techniques may be employed to form an asymmetrical side gate as shown in FIGS. 1b-1c. For example, after forming symmetrical first and second side gates, a patterned mask may be employed to expose one of the side gates for removal. The side gate exposed by the patterned mask, for example, is removed by an etch, such as a dry etch. Furthermore, the process of FIGS. 5a-5j may be modified to form the device shown in FIG. 2 by changing the implant parameters to form LDD regions 220 and 222 having a depth shallower than the depth of the S/D regions 125 and 127.

FIGS. 6a-6e show cross-sectional views of another embodiment of a process 600 for forming a device. The device formed by process 600 is the same as that shown in FIG. 3b and the process 600 is similar to the process 500 as described in FIGS. 5a-5j. In the interest of brevity, common elements and processes may not be described or described in detail.

Figure 6A:
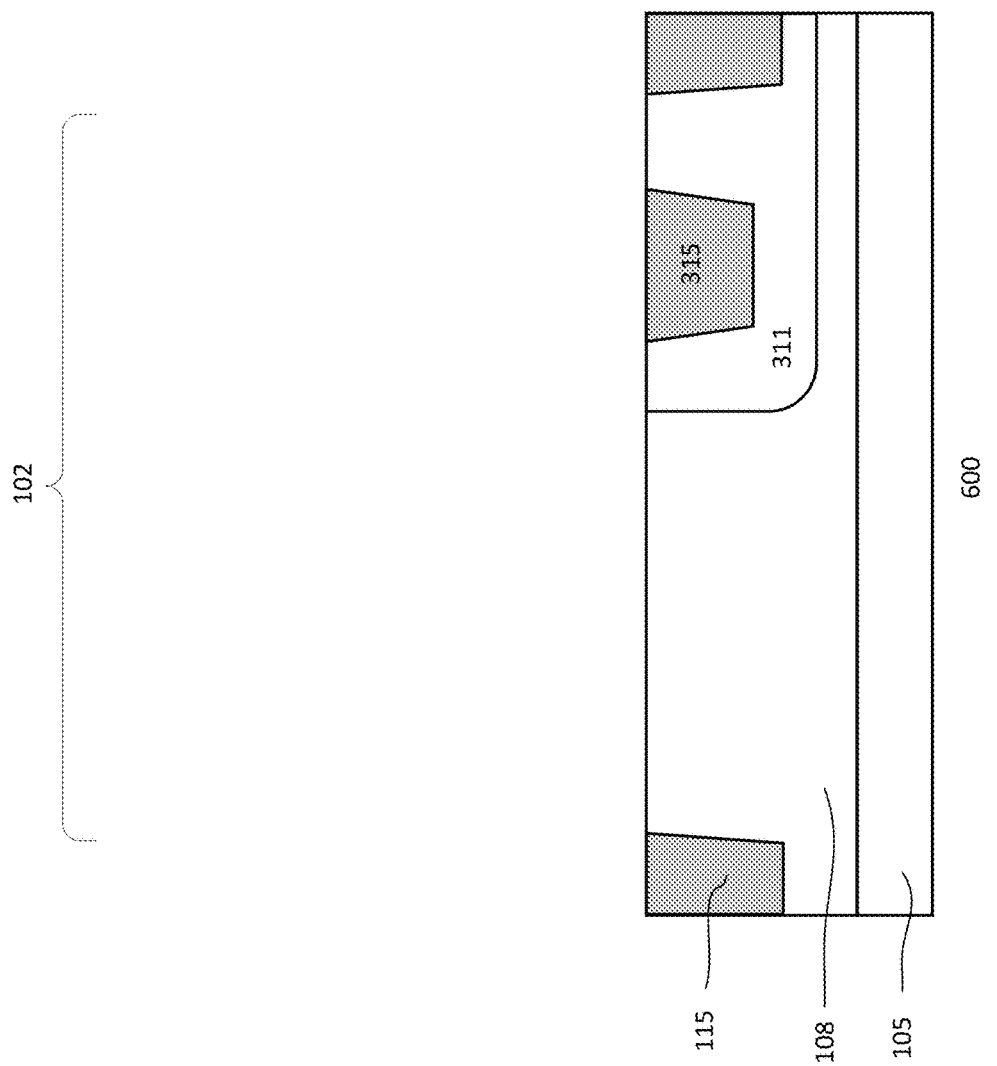
FIGS. 6a-6e show cross-sectional views of another embodiment of a process for forming a device.

Referring to FIG. 6a, a substrate 105 is provided. The substrate is prepared with a device region 102 and isolation regions. For example, the substrate may be prepared with a device isolation region 115 and an internal isolation region 315 within the device region. In one embodiment, forming the device isolation region may also form the internal isolation region. For example, the isolation regions 115 and 315 may be formed with the same depth from the substrate surface. Alternatively, the internal isolation region and the device isolation region may be formed in a separate process step. In such case, the isolation regions may be formed with different depths from the substrate surface. The isolation regions are, for example, STI regions. The device and internal isolation regions may also be different types of isolation regions.

As shown, a doped region 311 is formed in the device region within the device well 108. The doped region serves as a drift well for the device. The drift well encompasses the internal isolation region 315 on a first side of the device region. For example, the drift well has a depth deeper than the internal isolation region. Providing a drift well having other depth dimensions may also be useful. The depth of the drift well, for example, may depend on the device operation voltage.

To form the drift well, an implant mask which exposes a portion of the device region is used. Transistor type dopants are implanted into the substrate using the implant mask. The dopants are implanted with the appropriate dose and power to form the drift well having desired depth and dopant concentration. Other configurations of implant processes may also be employed to form the drift well.

Figure 6B:
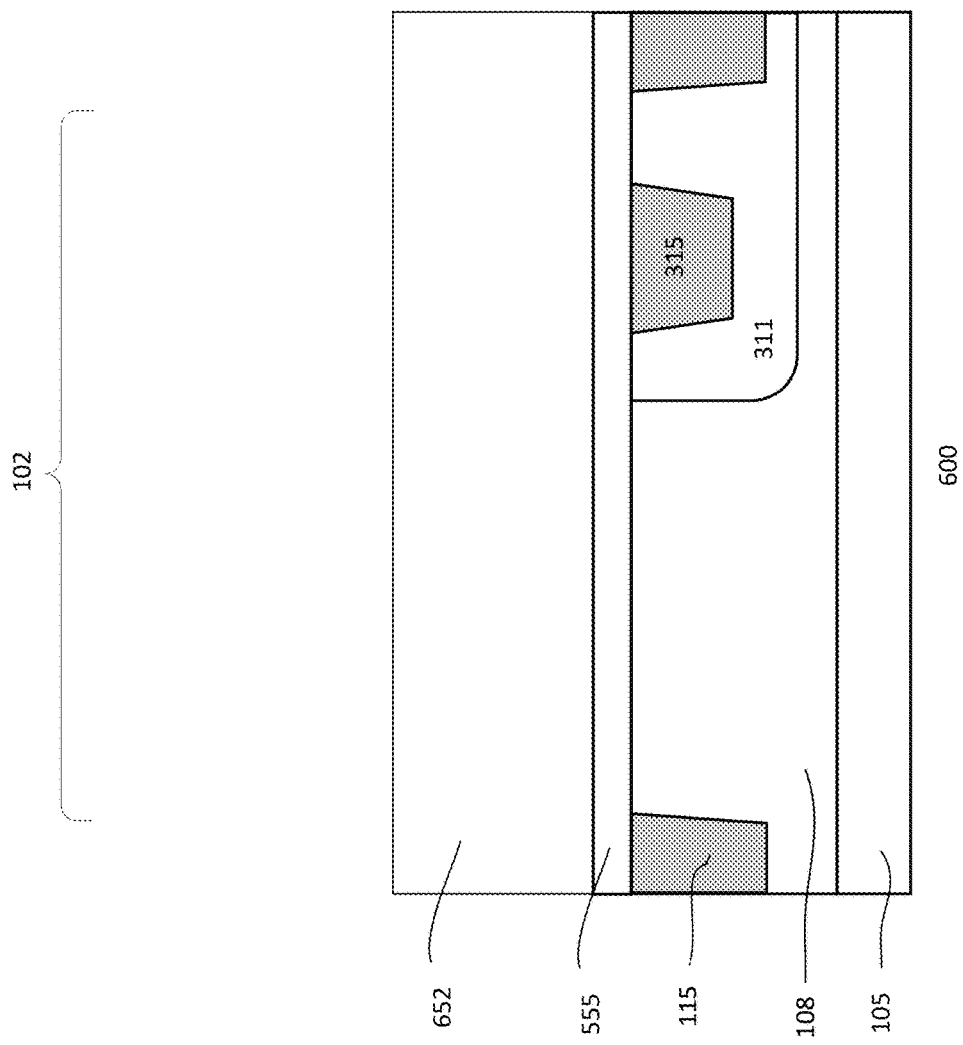

Referring to FIG. 6b, the process continues to form gate layers. In one embodiment, the gate layers include a gate dielectric layer 555 on the substrate and a gate electrode layer 652 thereon. The gate dielectric layer, for example, is silicon oxide. As for the gate electrode layer, it may be polysilicon. The thickness of the gate electrode layer may be about 400-1200 Å. Other thicknesses may also be useful. The gate electrode layer may be formed by, for example, CVD. Other techniques for forming the gate electrode layer may also be useful. The gate electrode layer can be formed as an amorphous or non-amorphous layer. In one embodiment, the gate electrode layer is polysilicon doped with first type dopants. For example, the concentration of dopants in the gate electrode layer may be at least about $1E20/cm^3$. Various techniques may be employed to dope the gate electrode layer, for example, in-situ doping or ion implantation.

Figure 6C:
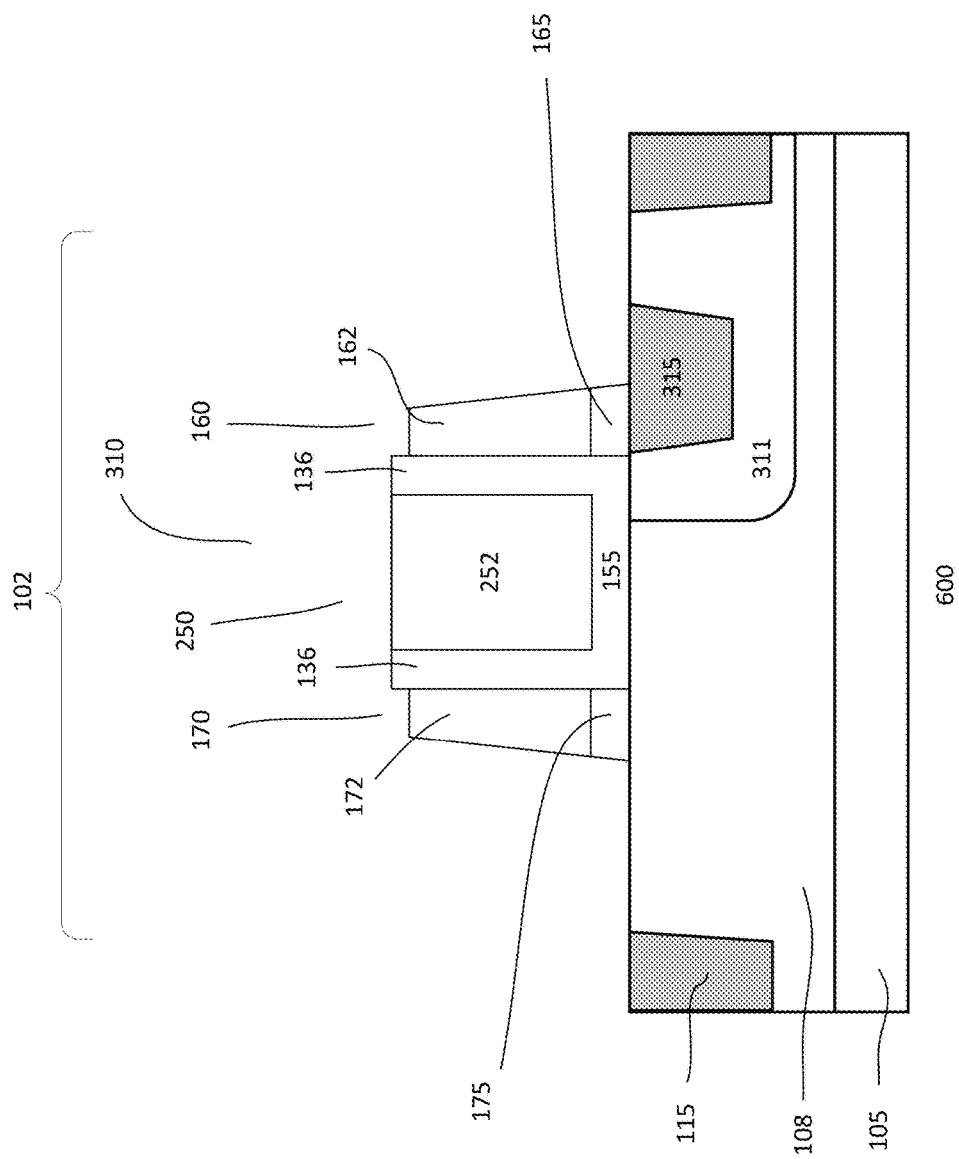

Referring to FIG. 6c, the gate electrode layer 652 is patterned to form an upper portion of the transistor gate. For example, the gate electrode layer is patterned to define the gate electrode 252 of a HV (or primary) gate.

After the HV gate formation, the process continues as described in FIGS. 5d-5f to form the inter-poly dielectric 136 and first and second side gates 160 and 170.

Figure 6D:
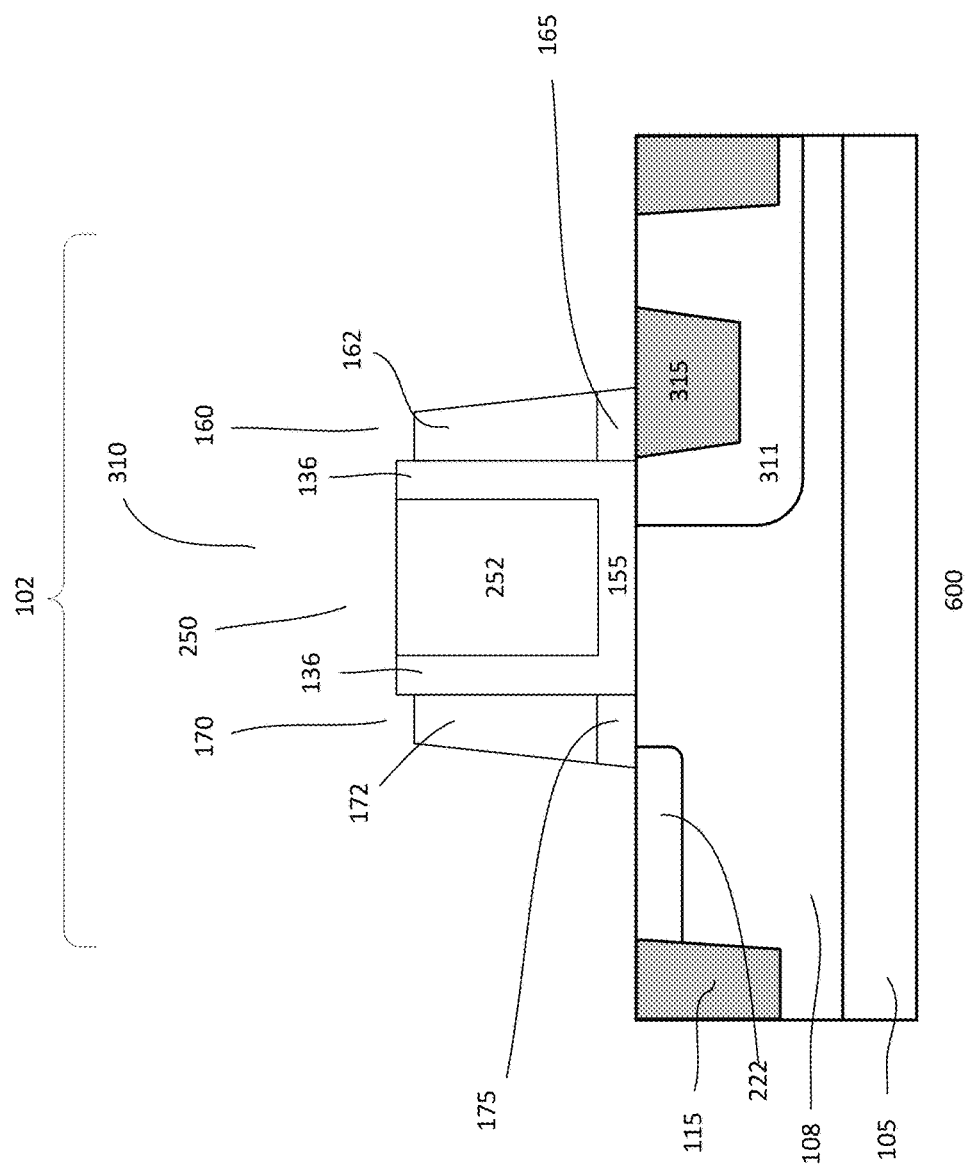

Referring to FIG. 6d, a lightly doped region 222 is formed in the substrate in the source region of the device. The lightly doped region includes transistor type dopants. The lightly doped region is, for example, a LDD region. To form the lightly doped region, transistor type dopants are implanted into the substrate. The implant, for example, may be self-aligned with respect to the device region. For example, the dopants may be introduced into the substrate unprotected by the HV gate 250, second side gate 170 and isolation region 115. The lightly doped region may be a shallow LDD region. In one embodiment, the light doped region 222 underlaps the second side gate. For example, dopant diffusion due to subsequent thermal processes, such as RTA to activate the dopants extends the lightly doped region under the second side gate.

Figure 6E:
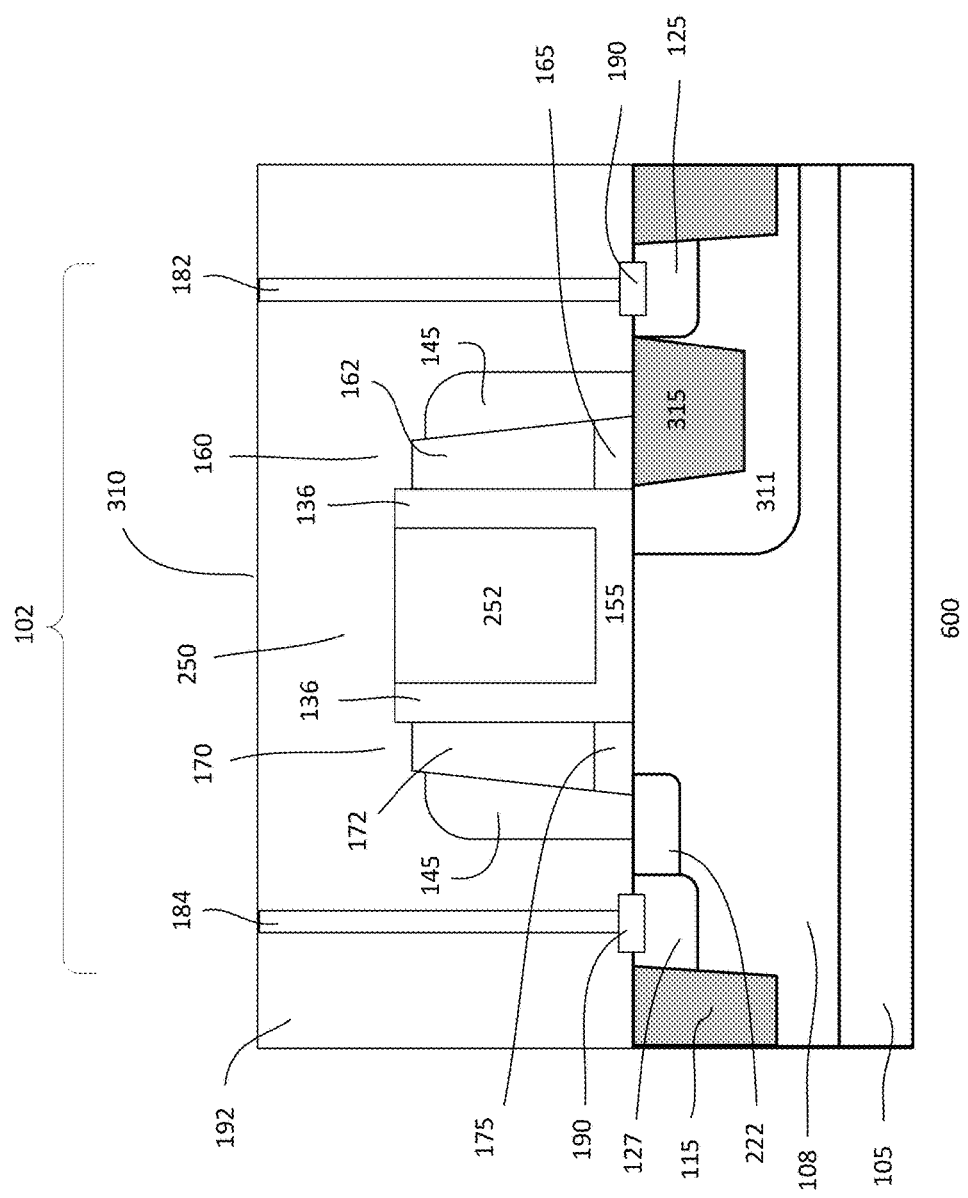

Referring to FIG. 6e, the process continues as described in FIGS. 5h-5j to form the device as shown and as described in FIG. 3b. Furthermore, it is understood that the process of FIGS. 6a-6e may be modified to form the device as shown and as described in FIG. 3a. For example, the process 600 may be modified such that no internal isolation region is formed. The process 600 may also be altered such that the HV gate includes top and bottom gate electrodes and an inter-gate layer formed between them as described in FIGS. 5c-5d.

Figure 7A:
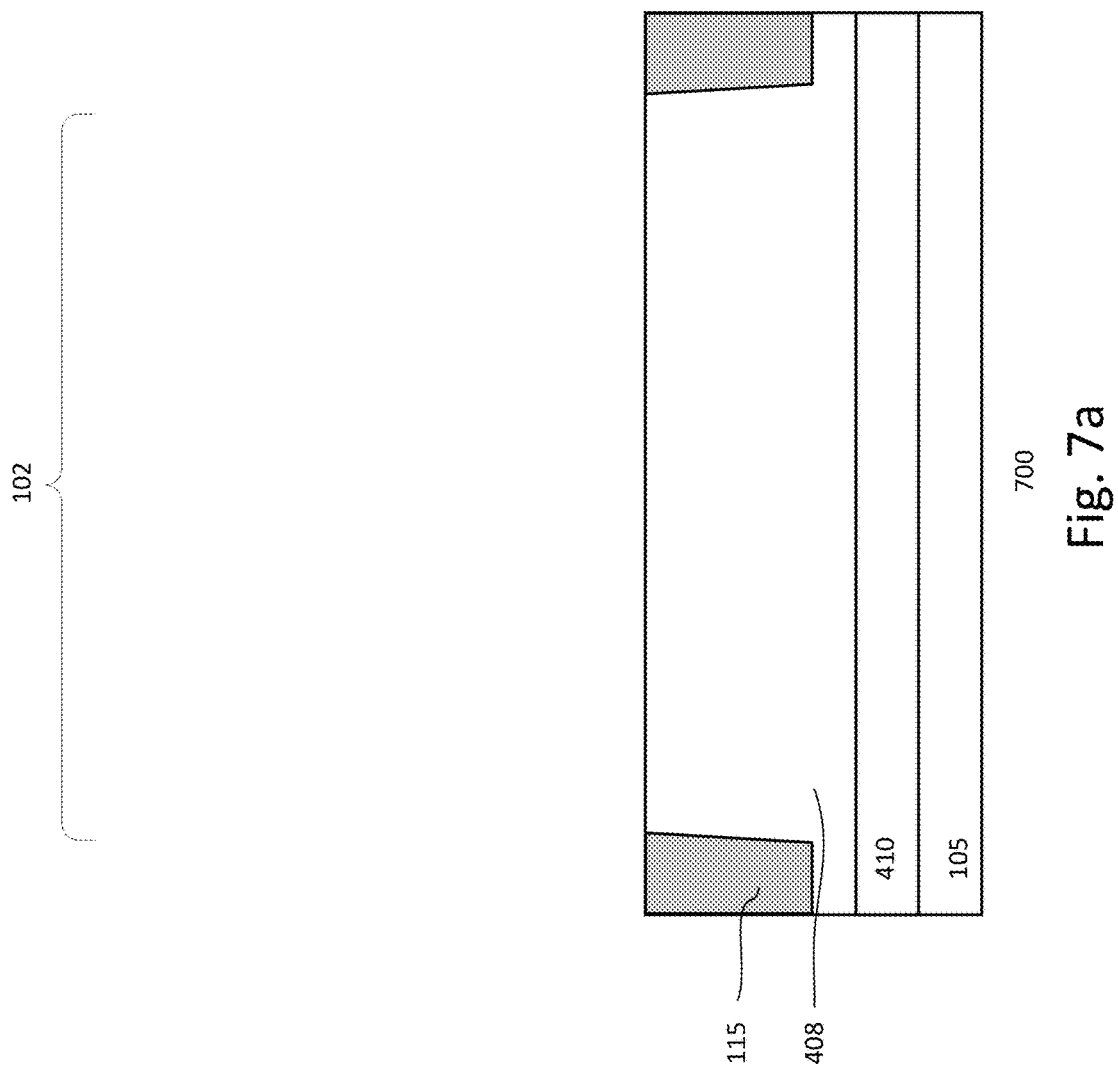
Figure 7B:
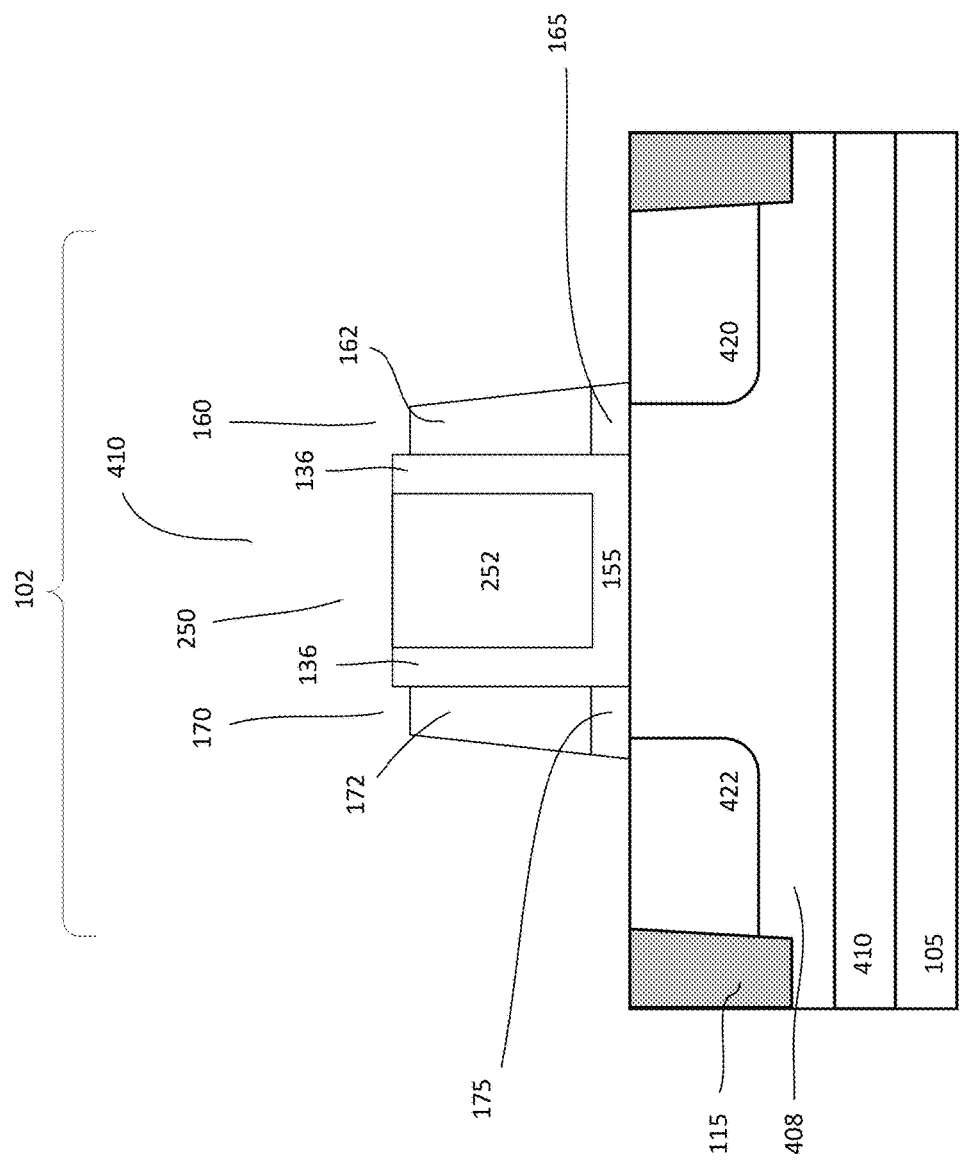

FIGS. 7a-7c show cross-sectional views of another embodiment of a process 700 for forming a device. The device formed by process 700 is the same as that shown in FIG. 4 and the process 700 is similar to the process 500 as described in FIGS. 5a-5j and the process 600 as described in FIGS. 6a-6e. In the interest of brevity, common elements and processes may not be described or described in detail.

Referring to FIG. 7a, a substrate 105 is provided. The substrate is prepared with a device region 102 and a device isolation region 115. The isolation region is, for example, STI region. A device well 408 is formed in substrate within the device region. In one embodiment, the device well is implanted with transistor type dopants and serves as a transistor body. For example, the device well is lightly doped with transistor type dopants.

In one embodiment, a buried layer 410 is formed in the substrate. As shown, the buried layer has a depth deeper than the device well. For example, the buried layer is disposed between the substrate and the device well 408. The buried layer is heavily doped with transistor type dopants and serves as a buried S/D layer or region.

In one embodiment, the device well and buried S/D region are formed by ion implantation. For example, a first implant forms the device well and a second implant forms the buried S/D region below the device well. Multiple implants using an implant mask (not shown) which exposes the device region may be performed to implant transistor type dopants to form the device well and buried S/D region. The implant mask, for example, is a photoresist layer. Suitable implant energies can be used to form the device well and buried S/D region. Other suitable techniques for forming the device well and buried S/D region may also be useful. For example, in an alternative embodiment, the buried layer 410 is formed in a top portion of the substrate 105 by ion implantation while the device well is formed by growing an epitaxial layer over the substrate.

Referring to FIG. 7b, the process continues as described in FIGS. 6b-6c to form a transistor gate structure. Details of these processes will not be described. As shown, lightly doped regions 420 and 422 are formed adjacent to the first and second sides of the transistor gate structure in the substrate within the device well. The lightly doped regions include second polarity type dopants for a first polarity type transistor. To form the lightly doped regions, second polarity type dopants are implanted into the substrate. The implant, for example, may be self-aligned with respect to the device region. For example, the dopants may be introduced into the substrate unprotected by the HV gate 250, first and second side gates 160 and 170 and isolation region 115. The lightly doped regions are deep LDD regions. In one embodiment, the light doped regions underlap the first and second side gates. For example, dopant diffusion due to subsequent thermal processes, such as RTA to activate the dopants extends the lightly doped regions under the first and second side gates.

Referring to FIG. 7c, the process continues as described in FIGS. 5h-5j to form the device as shown and as described in FIG. 4. Additional processes may be performed to complete the device. Such processes may include forming additional interconnect metal levels, final passivation, dicing, packaging and testing.

The present disclosure may be embodied in other specific forms without departing from the spirit or essential characteristics thereof. The foregoing embodiments, therefore, are to be considered in all respects illustrative rather than limiting the invention described herein. Furthermore, it is to be understood that the features of the various embodiments described herein are not mutually exclusive and can exist in various combinations and permutations. Scope of the invention is thus indicated by the appended claims, rather than by the foregoing description, and all changes that come within the meaning and range of equivalency of the claims are intended to be embraced therein.

What is claimed is:

1. A device comprising:
   a substrate prepared with a device isolation region, the device isolation region defines a high voltage (HV) device region, wherein the HV device region comprises a gate region defined thereon;
   a device well in the HV device region, wherein a first and a second heavily doped diffusion region are disposed within the device well;
   a transistor gate disposed in the gate region and between the first and second heavily doped diffusion regions, wherein a first and a second sidewall of the transistor gate are each lined with an inter-poly dielectric layer;
   at least one secondary gate disposed on the substrate in the gate region and adjacent to the transistor gate, wherein the at least one secondary gate abuts the inter-poly dielectric layer on the first sidewall of the transistor gate; and
   dielectric spacers disposed on the substrate and adjacent to the gate region, wherein the dielectric spacers are positioned away from the transistor gate, wherein the first and second heavily doped diffusion regions are laterally displaced about a same distance away from the transistor gate.

2. The device of claim 1 wherein the at least one secondary gate comprises a source side dual gate (SSDG) disposed between the transistor gate and the first heavily doped diffusion region, wherein the first heavily doped diffusion region is a transistor source region.

3. The device of claim 2 wherein the SSDG is a first secondary gate and the gate region comprises a second secondary gate, wherein the second secondary gate is a field plate gate disposed between the transistor gate and the second heavily doped diffusion region, wherein the second heavily doped diffusion region is a transistor drain region.

4. The device of claim 1 wherein the first and second heavily doped diffusion regions are laterally displaced away from an outer edge of the dielectric spacers and extend to a side of the device isolation region.

5. The device of claim 1 comprising first and second doped regions disposed within the device well and adjacent to the first and second sidewalls of the transistor gate.

6. The device of claim 5 wherein the first and second doped regions are lightly doped diffusion (LDD) regions, wherein the first and second LDD regions encompass the first and second heavily doped diffusion regions.

7. The device of claim 5 wherein the first doped region extends below the at least one secondary gate to underlap a portion of the transistor gate.

8. The device of claim 5 wherein the first and second doped regions comprise first polarity type dopants, wherein the first and second heavily doped diffusion regions comprise second polarity type dopants different from the first polarity type, wherein the first and second doped regions encompass the first and second heavily doped diffusion regions.

9. The device of claim 5 wherein the first doped region extends to partially underlap the at least one secondary gate without underlapping the transistor gate.

10. The device of claim 9 wherein the second doped region extends to partially underlap the transistor gate.

11. The device of claim 1 wherein the at least one secondary gate comprises first and second secondary gates abutting the inter-poly dielectric layer on the first and second sidewalls of the transistor gate without extending over the transistor gate.

12. The device of claim 1 wherein each of the transistor gate and the at least one secondary gate comprises a gate dielectric disposed directly on the substrate, wherein a gate dielectric thickness of the transistor gate is different from a gate dielectric thickness of the at least one secondary gate.

13. The device of claim 1 wherein the transistor gate comprises an inter-gate layer sandwiched between a top and a bottom gate electrode layer.

14. The device of claim 13 wherein the inter-gate layer comprises an oxide-nitride-oxide (ONO) stack.

15. The device of claim 1 wherein the transistor gate is a high voltage (HV) transistor gate, wherein the least one secondary gate is biased at a lower voltage value relative to the HV transistor gate.

16. A high voltage device comprising:
a substrate having a high voltage (HV) device region, wherein the HV device region comprises first and second heavily doped diffusion regions and a gate region defined thereon;
a device well disposed in the HV device region, wherein the device well encompasses the first and second heavily doped diffusion regions;
a primary gate disposed in the gate region;
at least one secondary gate disposed in the gate region and adjacent to a first or a second sidewall of the primary gate, wherein the at least one secondary gate is a field plate gate; and
dielectric spacers disposed on the substrate and adjacent to the gate region, wherein the first and second heavily doped diffusion regions are displaced away from the dielectric spacers, wherein the first and second heavily doped diffusion regions are disposed an equal distance away from the primary gate.

17. The high voltage device of claim 16 wherein a first and a second sidewall of the primary gate are each lined with an inter-poly dielectric layer.

18. The high voltage device of claim 16 comprising first and second doped regions disposed within the device well and adjacent to first and second sides of the primary gate, wherein the first doped region completely underlaps the first secondary gate and extends to partially underlap the primary gate.

19. The high voltage device of claim 16 comprising a second secondary gate disposed in the gate region, wherein the field plate gate is adjacent to the first sidewall of the primary gate and the second secondary gate is a source side dual gate (SSDG) disposed adjacent to the second sidewall of the primary gate.

20. A high voltage device comprising:
a substrate having a high voltage (HV) device region, wherein the HV device region comprises first and second heavily doped diffusion regions and a gate region defined thereon;
a device well disposed in the HV device region, wherein the device well encompasses the first and second heavily doped diffusion regions;
a primary gate disposed in the gate region, wherein a first and second sidewall of the primary gate are each lined with an inter-poly dielectric layer;
a first and a second secondary gate disposed in the gate region and adjacent to the first and second sidewalls of the primary gate, wherein the first secondary gate is a field plate gate; and
dielectric spacers disposed on the substrate and adjacent to the gate region, wherein the first and second heavily doped diffusion regions are displaced away from the dielectric spacers, wherein the first and second heavily doped diffusion regions are disposed an equal distance away from the primary gate.

* * * * *